(12) United States Patent
Juengling

(10) Patent No.: US 8,546,876 B2
(45) Date of Patent: Oct. 1, 2013

(54) SYSTEMS AND DEVICES INCLUDING MULTI-TRANSISTOR CELLS AND METHODS OF USING, MAKING, AND OPERATING THE SAME

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 564 days.

(21) Appl. No.: 12/052,317

(22) Filed: Mar. 20, 2008

(65) Prior Publication Data

US 2009/0238010 A1  Sep. 24, 2009

(51) Int. Cl.
*H01L 29/78* (2006.01)
*H01L 29/66* (2006.01)

(52) U.S. Cl.
USPC ........... 257/331; 257/330; 257/332; 257/401; 257/E27.06; 257/E27.084

(58) Field of Classification Search
USPC ................. 257/686, 242, 288, 296, 330–332, 257/365–366, 401, E27.06, E27.084
See application file for complete search history.

(56) References Cited

U.S. PATENT DOCUMENTS

| | | | |
|---|---|---|---|
| 3,885,861 A | 5/1975 | Farnsworth et al. | |
| 5,160,987 A | 11/1992 | Pricer et al. | |
| 5,196,910 A | 3/1993 | Moriuchi et al. | |
| 5,386,132 A * | 1/1995 | Wong | 257/316 |
| 5,661,061 A | 8/1997 | Usuami et al. | |
| 5,821,513 A | 10/1998 | O'Hagan et al. | |
| 5,858,829 A | 1/1999 | Chen | |
| 5,925,918 A | 7/1999 | Wu et al. | |
| 5,949,057 A | 9/1999 | Feng | |
| 6,008,513 A | 12/1999 | Chen | |
| 6,043,562 A | 3/2000 | Keeth | |
| 6,081,008 A | 6/2000 | Rostoker | |
| 6,100,129 A | 8/2000 | Tu et al. | |
| 6,130,551 A | 10/2000 | Agrawal et al. | |
| 6,216,257 B1 | 4/2001 | Agrawal et al. | |
| 6,258,656 B1 | 7/2001 | Lange et al. | |

(Continued)

FOREIGN PATENT DOCUMENTS

| | | |
|---|---|---|
| CN | 200980112123.1 | 12/2012 |
| DE | 19946719 | 4/2001 |

(Continued)

OTHER PUBLICATIONS

U.S. Appl. No. 12/033,768, filed Feb. 19, 2009, Werner Juengling.

(Continued)

*Primary Examiner* — Allison P Bernstein
(74) *Attorney, Agent, or Firm* — Wells St. John, P.S.

(57) ABSTRACT

A device may include a first transistor, a second transistor, and a data element. The first transistor may have a column gate and a channel, and the second transistor may include a row gate that crosses over the column gate, under the column gate, or both. The second transistor may also include another channel, a source disposed near a distal end of a first leg, and a drain disposed near a distal end of a second leg. The column gate may extend between the first leg and the second leg. The channel of the second transistor may be connected to the channel of the first transistor, and the data element may be connected to the source or the drain. Methods, systems, and other devices are contemplated.

24 Claims, 36 Drawing Sheets

(56) References Cited

U.S. PATENT DOCUMENTS

| | | |
|---|---|---|
| 6,258,659 B1 | 7/2001 | Gruening et al. |
| 6,268,243 B1 | 7/2001 | Park |
| 6,282,113 B1 | 8/2001 | DeBrosse |
| 6,316,309 B1 | 11/2001 | Holmes et al. |
| 6,380,759 B1 | 4/2002 | Agrawal et al. |
| 6,432,769 B1 | 8/2002 | Fukuda et al. |
| 6,440,792 B1 | 8/2002 | Shiao et al. |
| 6,504,755 B1* | 1/2003 | Katayama et al. ....... 365/185.15 |
| 6,689,660 B1 | 2/2004 | Noble et al. |
| 6,845,033 B2 | 1/2005 | Kirihata et al. |
| 6,897,107 B2 | 5/2005 | Divakaruni et al. |
| 6,927,462 B2 | 8/2005 | Goodwin et al. |
| 6,967,147 B1 | 11/2005 | Tews et al. |
| 6,998,666 B2 | 2/2006 | Beintner et al. |
| 7,091,543 B2 | 8/2006 | Tzeng et al. |
| 7,098,105 B2 | 8/2006 | Juengling |
| 7,099,216 B2 | 8/2006 | Luk et al. |
| 7,132,333 B2 | 11/2006 | Schloesser et al. |
| 7,151,023 B1 | 12/2006 | Nayfeh et al. |
| 7,190,060 B1 | 3/2007 | Chiang |
| 7,195,995 B2 | 3/2007 | Mouli |
| 7,205,606 B2 | 4/2007 | Tran |
| 7,345,937 B2 | 3/2008 | Yoon et al. |
| 7,879,659 B2 | 2/2011 | Wilson et al. |
| 2001/0003034 A1 | 6/2001 | Furukawa et al. |
| 2001/0046753 A1 | 11/2001 | Gonzalez et al. |
| 2002/0155656 A1 | 10/2002 | Hayano et al. |
| 2003/0117865 A1* | 6/2003 | Hofmann et al. ............. 365/200 |
| 2003/0168686 A1 | 9/2003 | Itabashi et al. |
| 2003/0198073 A1 | 10/2003 | Keeth |
| 2004/0027848 A1 | 2/2004 | Wald et al. |
| 2004/0043592 A1 | 3/2004 | Goodwin et al. |
| 2004/0062069 A1 | 4/2004 | Keeth |
| 2004/0125636 A1 | 7/2004 | Kurjanowicz et al. |
| 2004/0202027 A1 | 10/2004 | Kuzmenka et al. |
| 2005/0024936 A1 | 2/2005 | Forbes |
| 2005/0094453 A1 | 5/2005 | Forbes |
| 2005/0133852 A1 | 6/2005 | Shau |
| 2005/0139884 A1 | 6/2005 | Lane |
| 2005/0151206 A1 | 7/2005 | von Schwerin |
| 2005/0196918 A1 | 9/2005 | von Schwerin |
| 2005/0245024 A1 | 11/2005 | von Schwerin |
| 2005/0280102 A1 | 12/2005 | Oh et al. |
| 2006/0006446 A1 | 1/2006 | von Schwerin |
| 2006/0028861 A1* | 2/2006 | Han et al. ...................... 365/154 |
| 2006/0057814 A1 | 3/2006 | Weis |
| 2006/0073662 A1 | 4/2006 | Jang et al. |
| 2006/0076602 A1 | 4/2006 | Harter et al. |
| 2006/0084195 A1* | 4/2006 | Lyu .................................. 438/48 |
| 2006/0131637 A1 | 6/2006 | Kakoschke et al. |
| 2006/0131651 A1 | 6/2006 | Sato et al. |
| 2006/0220134 A1* | 10/2006 | Huo et al. ...................... 257/351 |
| 2006/0244106 A1 | 11/2006 | Morikado |
| 2006/0245238 A1 | 11/2006 | Turner |
| 2006/0246607 A1 | 11/2006 | Fazan et al. |
| 2006/0258109 A1 | 11/2006 | Juengling |
| 2006/0270151 A1 | 11/2006 | Lee |
| 2006/0273415 A1 | 12/2006 | Kim |
| 2006/0281249 A1 | 12/2006 | Yilmaz |
| 2006/0281250 A1 | 12/2006 | Schloesser |
| 2007/0010058 A1 | 1/2007 | Juengling |
| 2007/0023805 A1 | 2/2007 | Wells et al. |
| 2007/0052040 A1 | 3/2007 | Schwerin |
| 2007/0104010 A1 | 5/2007 | Hardy et al. |
| 2007/0111455 A1 | 5/2007 | Kim et al. |
| 2007/0121414 A1 | 5/2007 | Butler |
| 2007/0134878 A1 | 6/2007 | Brask et al. |
| 2007/0145450 A1 | 6/2007 | Wang et al. |
| 2007/0166933 A1 | 7/2007 | Song et al. |
| 2007/0170522 A1 | 7/2007 | Lee et al. |
| 2007/0176221 A1 | 8/2007 | Nakamura |
| 2007/0176222 A1 | 8/2007 | Ikemasu et al. |
| 2007/0176253 A1 | 8/2007 | Wang et al. |
| 2007/0190736 A1 | 8/2007 | Liu et al. |
| 2007/0262375 A1 | 11/2007 | Juengling |
| 2008/0064160 A1 | 3/2008 | Kim et al. |
| 2008/0242034 A1* | 10/2008 | Mokhlesi et al. ............. 438/287 |
| 2008/0296702 A1 | 12/2008 | Lee et al. |
| 2009/0146243 A1 | 6/2009 | Lee |

FOREIGN PATENT DOCUMENTS

| | | |
|---|---|---|
| JP | 2006313911 | 11/2006 |
| KR | 930005234 | 6/1993 |
| KR | 20020018071 | 3/2002 |
| TW | 380316 | 1/2000 |
| TW | 388125 | 4/2000 |
| TW | 098109791 | 6/2012 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |
| WO | PCT/US2009/036180 | 10/2009 |
| WO | PCT/US2009/036180 | 10/2010 |

OTHER PUBLICATIONS

U.S. Appl. No. 12/033,780, filed Feb. 19, 2008, Werner Juengling.
U.S. Appl. No. 12/033,799, filed Feb. 19, 2008, Werner Juengling.
U.S. Appl. No. 12/043,813, filed Mar. 6, 2008, Werner Juengling.
U.S. Appl. No. 12/052,300, filed Mar. 20, 2008, Werner Juengling.
U.S. Appl. No. 12/052,317, filed Mar. 20, 2008, Werner Juengling.
U.S. Appl. No. 12/052,537, filed Mar. 20, 2008, Werner Juengling.
U.S. Appl. No. 12/062,354, filed Apr. 3, 2008, Werner Juengling.
U.S. Appl. No. 12/130,825, filed May 30, 2008, Werner Juengling.
Betty Prince, Ph.D.; "Trends in Scaled and Nanotechnology Memories"; Memory Strategies International; Leander, Texas; 2005.
Branislav Curanovic; "Development of a Fully-Depleted Thin-Body FinFET Process"; Department of Microelectronic Engineering, College of Engineering; Rochester Institute of Technology; Rochester, New York; Nov. 2003.
Claeys, COR; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium.
Enrico Gili; "Fabrication of Vertical MOSFETs With Reduced Parasitics and Suppression of Short Channel Effects"; Department of Electronics and Computer Science, Microelectronics Group; University of Southampton, Jun. 2004 http://66.102.1.104/scholar?hl=en&lr=&q=cache:BErKI49qg2MJ:www.ecs.soton.ac.uk/~eg02r/Publications/MinithesisEGili.
pdf+dram+fins+%22process+flow%22+%22vertical+access%22.
F. Fishburn, et al.; "A 78nm 6F2 DRAM Technology for Multigigabit Densities".
J. Sturm, et al.; "Increased Transconductance in Fully-Depleted Ultra-Thin Silicon-on-Insulator MOSFETs"; 6 pages.
J-H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimental 256Mb Non-Volatile DRAM with Cell Plate Boosted Programming Technique". IEEE International Solid-State Circuits Conference, ISSCC 2004 / Session 2 / Non-Volatile Memory / 2.2, 2004.
R. Katsumata, et al.; "Fin-Array-FET on bulk silicon for sub-100 nm Trench Capacitor DRAM"; 2003 Symposium on VLSI Technology Digest of Technical Papers; Jun. 2003, 2 pages.
T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.
Bor-Wen Chan, Min-Hwa Chi, Liou, Y.H; Notch Elimination in Polycide Gate Stack Etching for Advanced DRAM Technology; Center for Technol. Dev., Worldwide Semicond. Manuf. Corp., Hsinchu; http://ieeexplore.ieee.org/xpl/freeabs_all.jsp?tp=&arnumber=883094&isnumber=19090.
Chien Yu, Rich Wise, Anthony Domenicucci; A Two-Step Spacer Etch for High-Aspect-Ration Gate Stack Process; IBM Microelectronics; http://www.mrs.org/s_mrs/s_mrs/sec_subscribe.asp?CID=2353&DID=113693&ation=detail.
Ikeda, H., Inukai, H.; High-Speed DRAM Architecture Development; NEC Corp., Sagamihara; Solid-State Circuits, IEEE Journal;

May 1999; vol. 34, Issue 5, pp. 685-692; http://ieeexplore.ieee.org/xpls/abs_all.jsp?arnumber=760380&isnumber=16453.

Endoh, T., Shinmei, K., Sakuraba, H., Masuoka, F.; New Three-Dimensional Memory Array Architecture for Future Ultrahigh-Density DRAM; Res. Inst. Of Electrical Communication, Tohoku University, Sendai; Solid-State Circuites, IEEE Journal; Apr. 1999; vol. 34, Issue 4, pp. 476-483; hottp://ieeexplore.ieee.org/xpls/abs_all.jsp?arnumber=753680.

Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

Johgn-Man Park, Sang-Yeon Han, Chang-Hoon Jeon, Si-Ok Sohn, Jun-Bum Lee, Yamada, S., Shin-Deuk Kim, Wook-Je Kim; Wouns Yang, Donggun Park, Byung-Il Ryu; Fully Integrated Advanced Bulk FinFETs Architecture Featuring Partially-Insulating Technique for DRAM Cell Application of 40nm Generation and Beyond; http://ieeexplore.ieee.org/xpl/freeabs_all.jsp?arnumber=4154360.

* cited by examiner

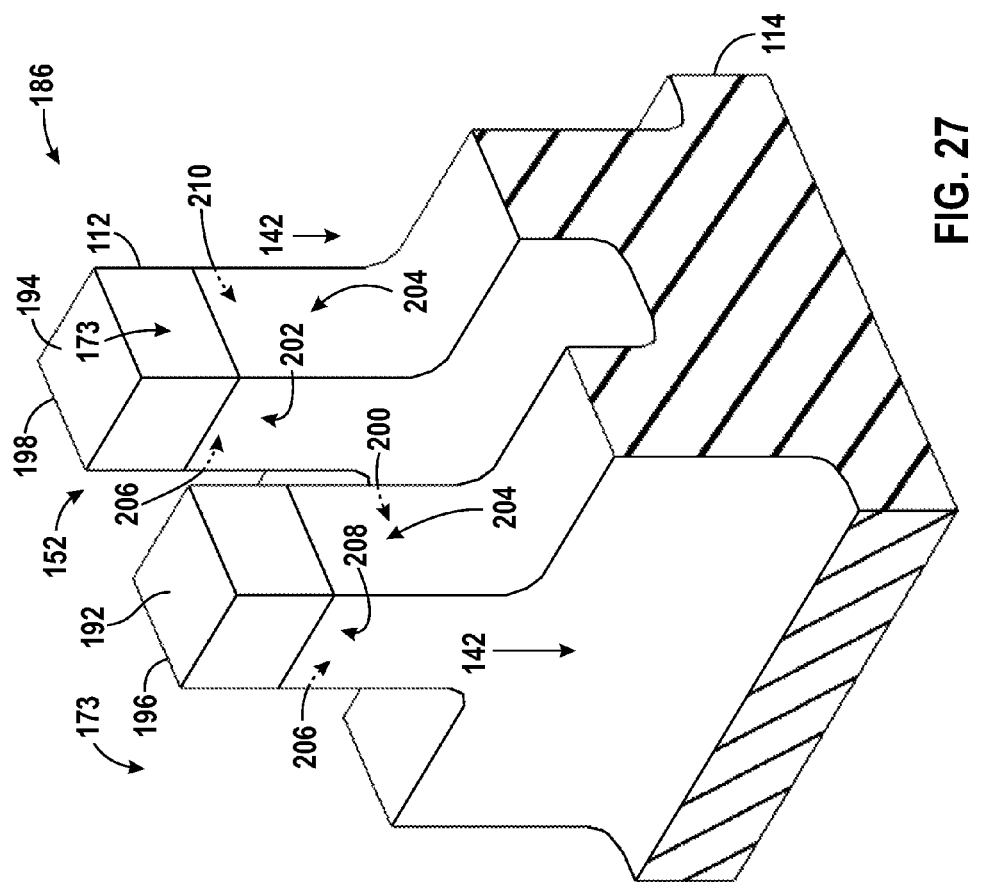
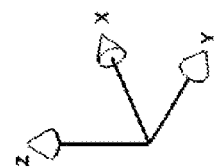
FIG. 27

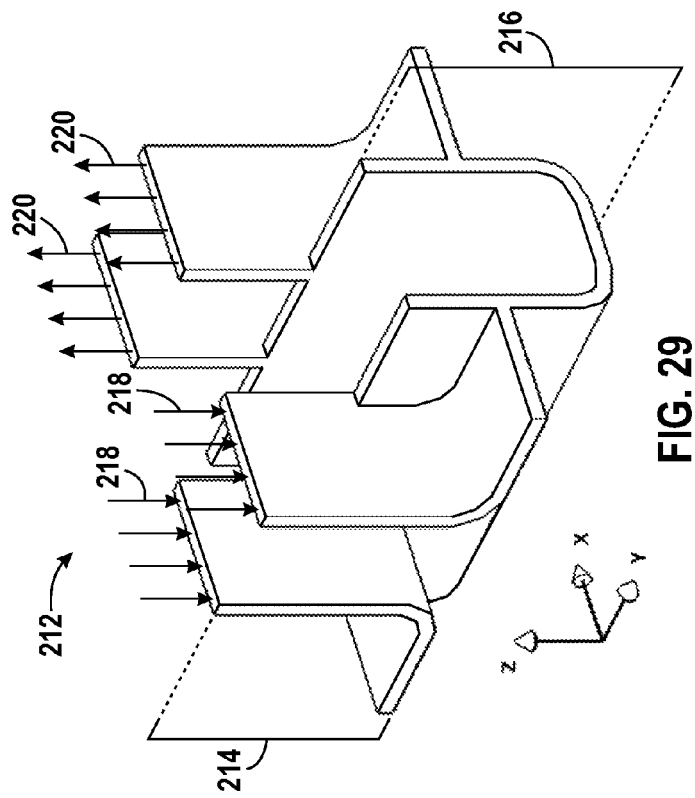
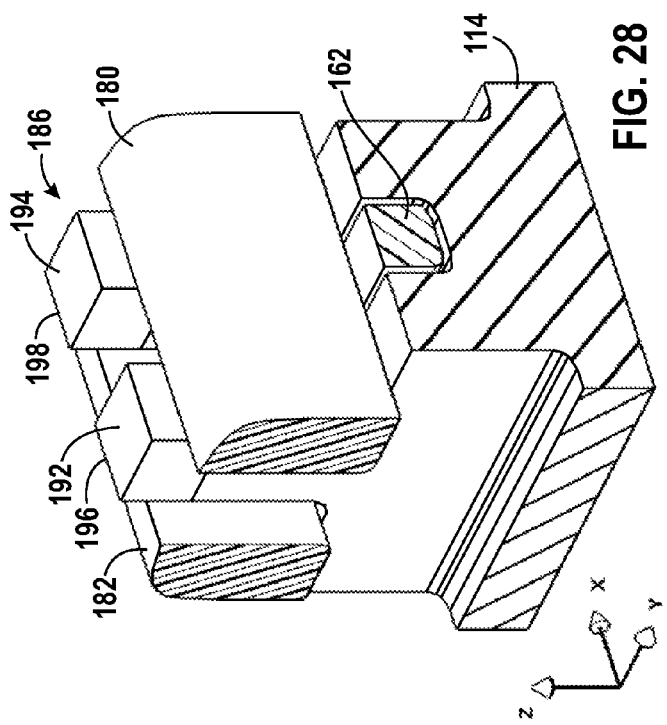
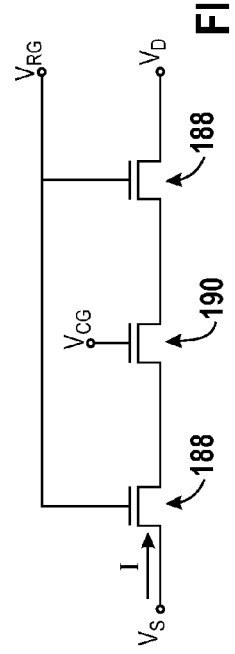
FIG. 28
FIG. 29
FIG. 30

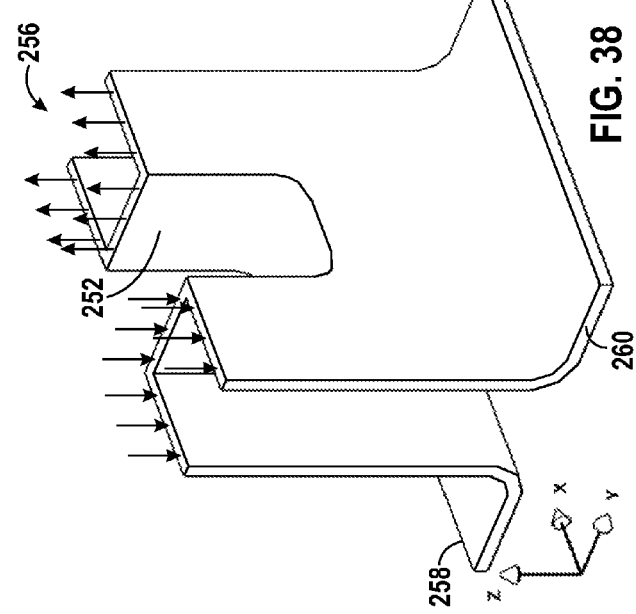
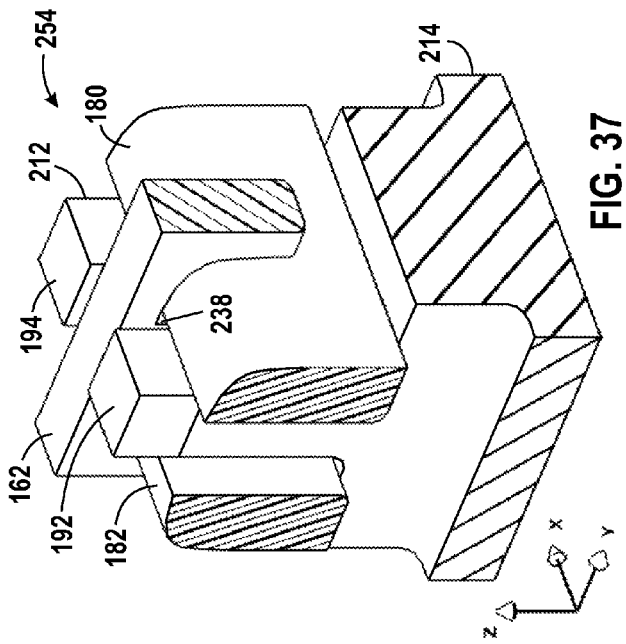
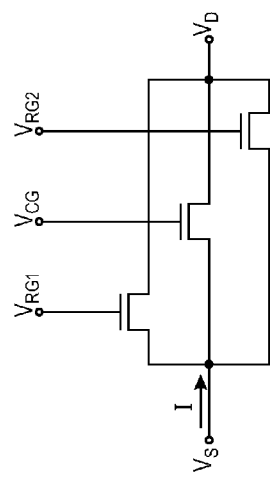
FIG. 38
FIG. 37
FIG. 39

SYSTEMS AND DEVICES INCLUDING MULTI-TRANSISTOR CELLS AND METHODS OF USING, MAKING, AND OPERATING THE SAME

BACKGROUND

1. Field of Invention

Embodiments of the invention relate generally to electronic devices and, more specifically, to electronic devices having multi-transistor cells.

2. Description of Related Art

Many types of electronic devices include data cells with a single transistor. Typically, the transistor controls whether a stimulus (e.g., a current or voltage) is applied to, or by, a data element (e.g., a memory element, an imaging element, or other device configured to output data, such as various kinds of sensors). Often a large number of data elements are disposed in an array, and the transistor allows individual data elements in the array to be selected. For example, certain types of dynamic random access memory (DRAM) include both a capacitor, which functions as a data element, and a single transistor connected to the capacitor. The capacitor usually stores data by storing a charge that is representative of data (e.g., a 0 or a 1 in a single-bit device, or a 00, 01, 10, or 11 in a two-bit device), and the transistor typically controls access to the capacitor by controlling the flow of current to and from the capacitor, allowing current to flow during reading and writing and preventing current from flowing when retaining data. In another example, some non-volatile memory devices include a single transistor connected to a body of phase-change material. Typically, the phase-change material stores data by assuming a more or less ordered state, e.g., a crystalline or amorphous state, that corresponds with a data value. The data value may be read by sensing the state of the phase-change material, typically by conducting a current through the phase-change material and sensing its resistance. The current is generally controlled by the transistor. In each of these examples and many others, the data element is connected to a single transistor that affects the flow of data to or from the data element.

BRIEF DESCRIPTION OF DRAWINGS

FIGS. 1-30 illustrate steps in a process for forming a dual-transistor data cell in accordance with an embodiment of the present technique, with FIG. 44 being a modification of that which is shown in FIG. 27;

FIGS. 37-39 illustrate a fourth embodiment of a dual-transistor data cell;

DETAILED DESCRIPTION

Figure 1:
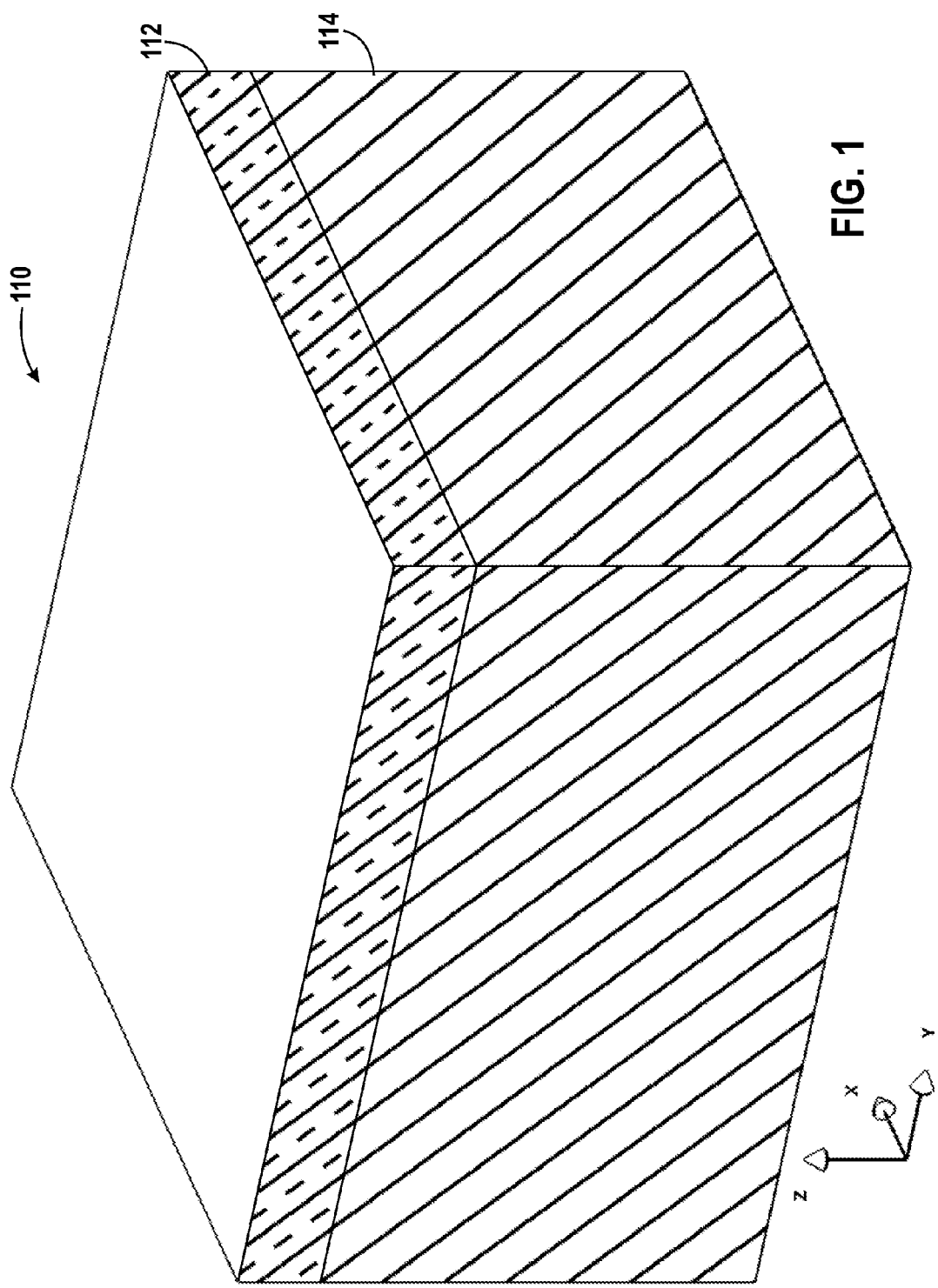

As explained below, a variety of devices may be improved by including multi-transistor data cells. For example, certain conventional-DRAM devices include dummy data cells that increase the device's cost per unit memory. The dummy cells are typically used for comparing against data cells being read. In operation, the dummy data cells generally provide a reference signal that is compared to a signal from the data cell being read, and the signal from the cell being read is categorized based on whether it is larger or smaller than the reference signal. These dummy cells, however, consume space that could otherwise be used to store data.

This problem may be alleviated by certain embodiments of a multi-transistor data cell. The additional transistors in the multi-transistor data cells may be used to temporarily disable certain rows or columns of data cells so that the disabled group of data cells may be used as a reference by a sense amplifier that is reading from another data cell. Selectively disabling groups of data cells for use as a reference may allow designers to avoid including dummy data cells and lower the cost of memory, increasing the amount of memory on a die.

The benefits offered by certain embodiments of multi-transistor data cells is not limited to DRAM. Multi-transistor data cells, in certain embodiments, have a variety of uses. In another example, dual-transistor data cells may include two transistors connected to one another in parallel so that the resistance to current flowing to or from the data cell may be adjusted by energizing one or both transistors. This may be useful to calibrate the data cell or change a mode of operation of the data cell. In a third example, dual-transistor data cells may be used to form a crosspoint array, in which a plurality of data cells share a common path for data to flow to or from data elements, a path such as a conductive plate or a substrate connected to the plurality of data cells. In some crosspoint arrays, each of the data cells may be selected by energizing generally orthogonal gates associated with each of its transistors.

Despite the utility of multi-transistor data cells, multi-transistor data cells are typically not used in conventional devices because, compared to single-transistor data cells, multi-transistor data cells are often relatively large. For instance, constructing a dual-transistor data cell with transistors placed side-by-side generally consumes twice as much surface area as a typical single-transistor data cell. Thus, to economize space, designers have typically favored data cells with a single transistor despite the additional design options offered by multi-transistor memory cells.

The following describes a process for making a space-efficient dual-transistor data cell and describes systems that may benefit from such devices. As explained below, some of the following dual-transistor data cells consume relatively little surface area because they include stacked transistors, i.e., the data cells include a first transistor that is built on top of a second transistor. Stacking the transistors reduces the amount of area consumed by each dual-transistor data cell, thereby potentially removing one of the disincentives to using these types of data cells.

A process for making dual-transistor memory cells is described below with reference to FIGS. 1-30, and a first step in this process is illustrated by FIG. 1. The process may begin with providing a substrate 110. The substrate 110 may include semiconductive materials such as single-crystal or poly-crystalline silicon, gallium arsenide, indium phosphide, or other materials with semiconductor properties. Alternately, or additionally, the substrate 110 may include a non-semiconductor body on which an electronic device may be constructed, bodies such as a plastic or ceramic work surface. The term "substrate" encompasses these structures in a variety of stages of manufacture, including an unprocessed-whole wafer, a partially-processed-whole wafer, a fully-processedwhole wafer, a portion of a diced wafer, or a portion of a diced wafer in a packaged-electronic device.

The substrate 110 may include an upper doped region 112 and a lower doped region 114. The depth of the upper doped region 112 may be generally uniform over a substantial area of the substrate 110, and the upper doped region 112 may be doped differently from the lower doped region 114. For example, the upper-doped region 112 may include an n+ material and the lower-doped region 114 may include a p− material. As explained below, material from the upper doped region 112 may form a source and a drain of subsequently-formed in transistors, and the channel of these transistors may be formed by material from the lower doped region 114.

Figure 2:
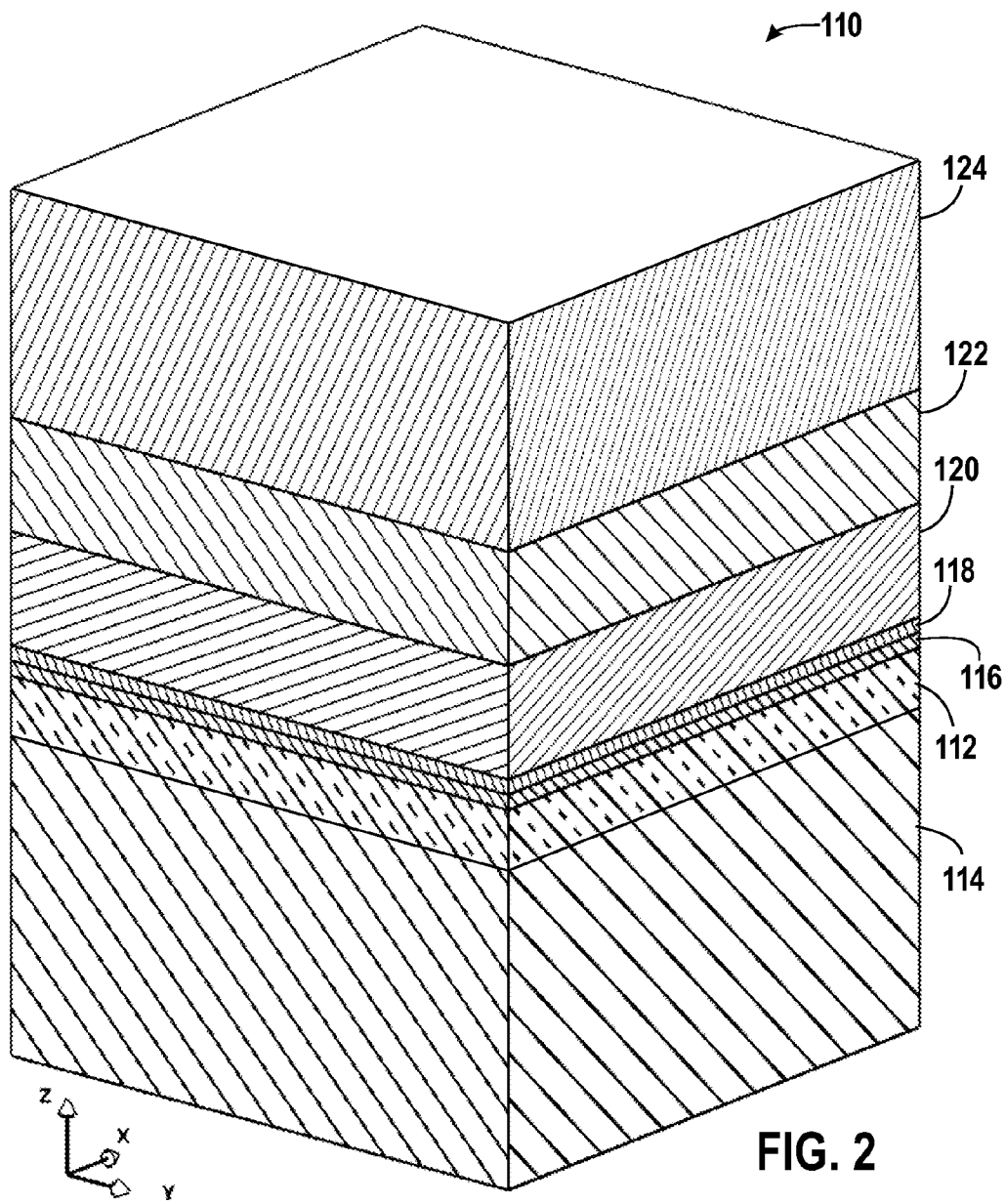

Next, several materials may be formed on the substrate 110, as illustrated by FIG. 2. In the discussion and claims herein, the term "on" used with respect to two materials, one "on" the other, means at least some contact between the materials, while "over" means the materials are in close proximity, but possibly with one or more additional intervening materials such that contact is possible but not required. In the illustrated embodiment, a pad oxide 116 may be formed on the upper doped region 112. The pad oxide 116 may have a thickness less than 300 Å, e.g., generally near 80 Å. A stop body (e.g., a body) 118 may be formed on the pad oxide 116. The stop body 118 may include a nitride and it may have a thickness less than 300 Å, e.g., generally near 95 Å. A sacrificial body 120 may be formed on the stop body 118. The sacrificial body 120 may be made of polysilicon and it may have a thickness between 500 Å and 2,000 Å, e.g., generally near 1000 Å. A lower masking body 122 may be formed on the sacrificial body 120. The lower masking body 122 may be made of an oxide and it may have a thickness between 500 Å and 2,000 Å, e.g., generally near 1000 Å. Finally, an upper masking body 124 may be formed on the lower masking body 122. The upper masking body 124 may be made of carbon, and it may have a thickness between 1000 Å and 3000 Å, e.g., generally near 2000 Å.

Figure 3:
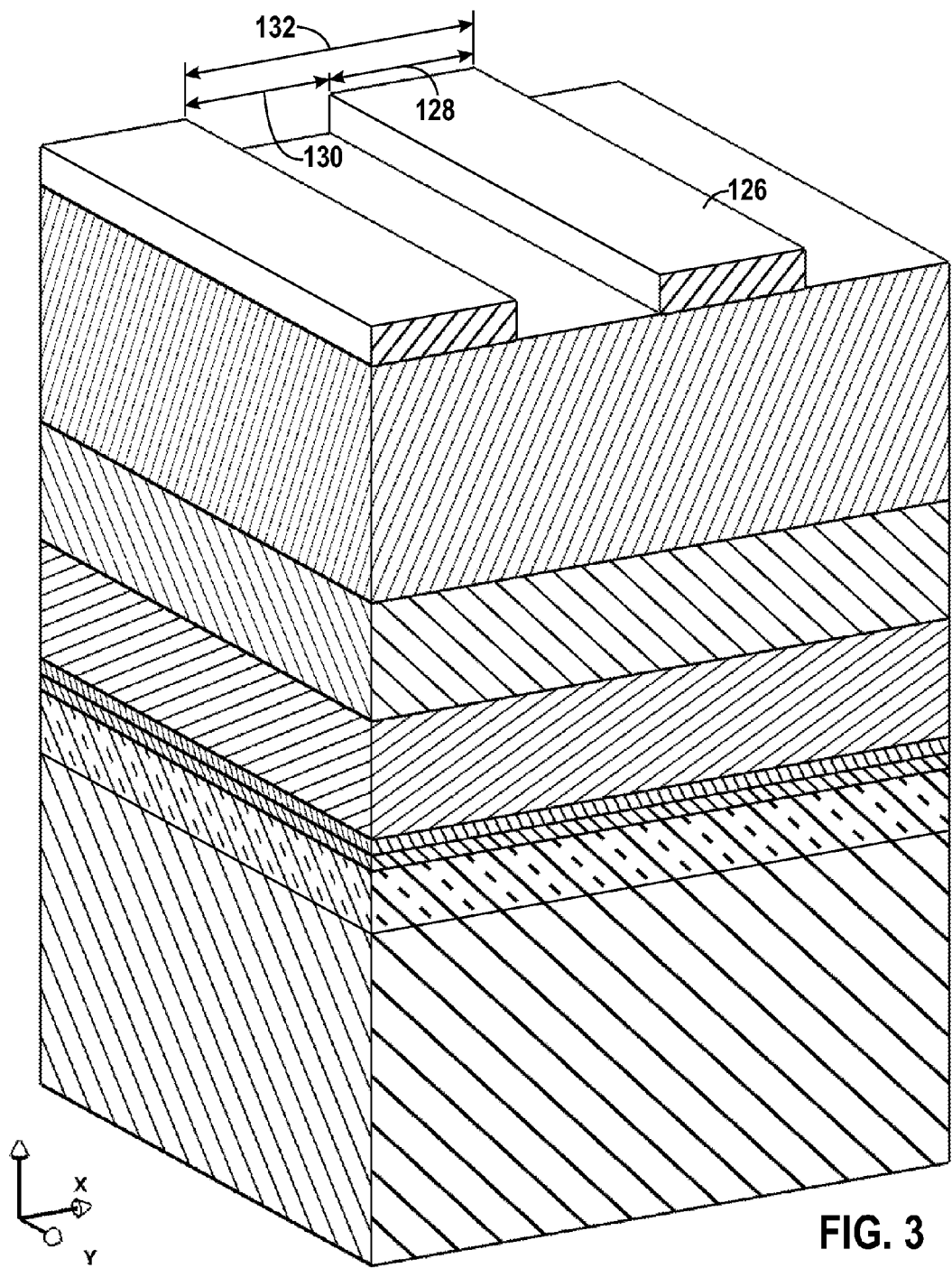

Next, a column mask 126 may be formed, as illustrated by FIG. 3. (The term "column" does not refer to any particular direction on the substrate 110 other than a direction that is different from the direction that subsequently-introduced rows extend.) The column mask 126 may include a pattern of lines that define masked regions having a width 128 and exposed regions having a width 130. The widths 128 and 130 may be generally equal to each other and each generally equal to the lithographic-resolution limit, referred to as "F." The column mask 126 may have a pitch 132 that is generally equal to 2 F. The lines formed by the column mask 126 may be generally straight, generally parallel to each other, and they may generally extend in the Y direction. These lines may be generally continuous and generally uniform in the Y direction over a substantial distance, e.g., a distance larger than 20 F. In other embodiments, though, the lines formed by the column mask 126 may have other shapes, e.g., they may undulate (e.g., up and down, left and right, or both), they may vary in width in the Y direction, or they may be formed from a plurality of shorter segments.

Figure 4:
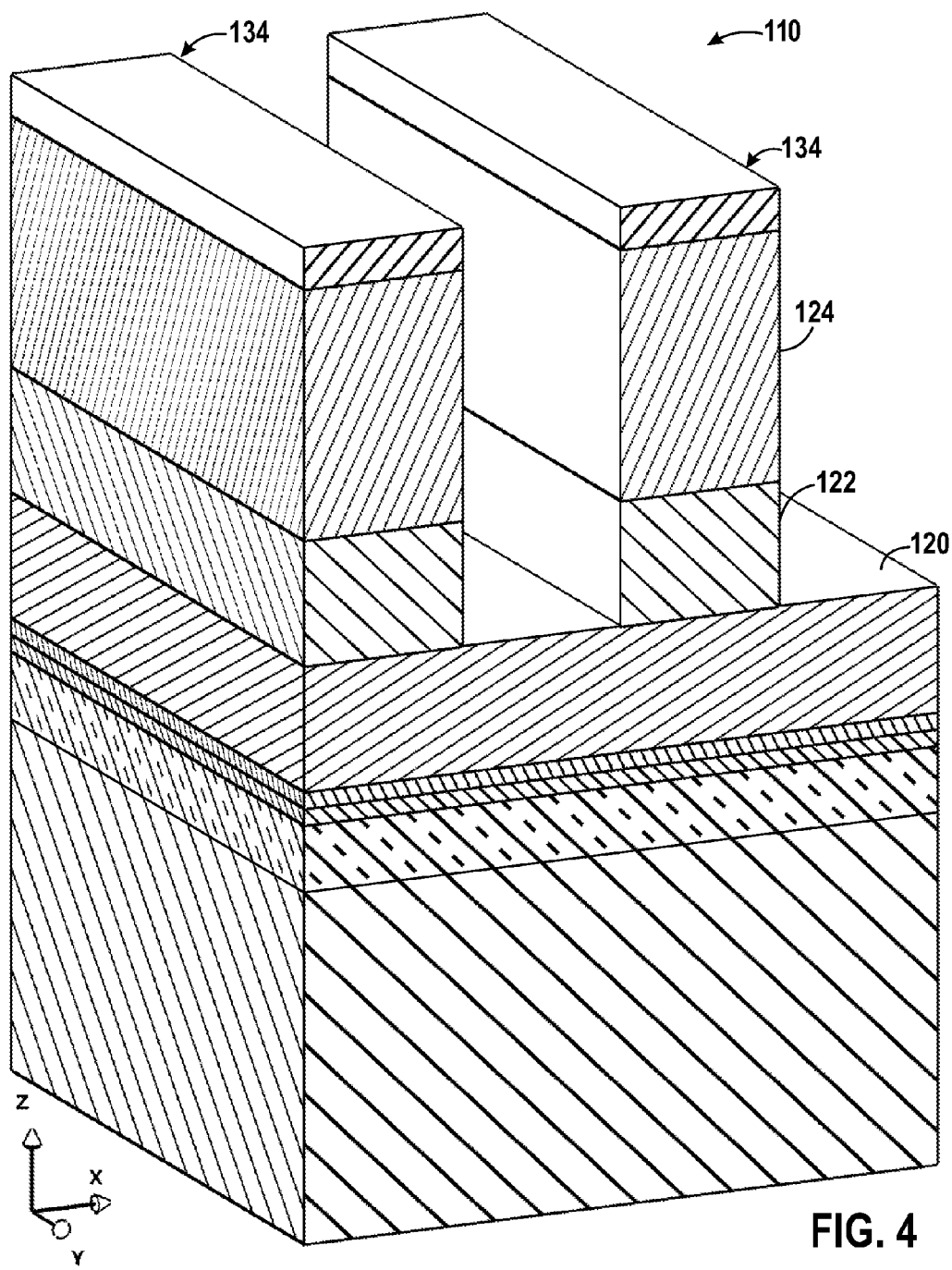

After forming the column mask 126, a column hard mask 134 may be formed, as illustrated by FIG. 4. The column hard mask 134 may be formed by generally anisotropically etching, e.g., with a directional plasma etch, the portion of the upper masking body 124 and the portion of lower masking body 122 that are disposed under the region exposed by the column mask 126. In some embodiments, the etch may stop on or in the sacrificial body 120.

Figure 5:
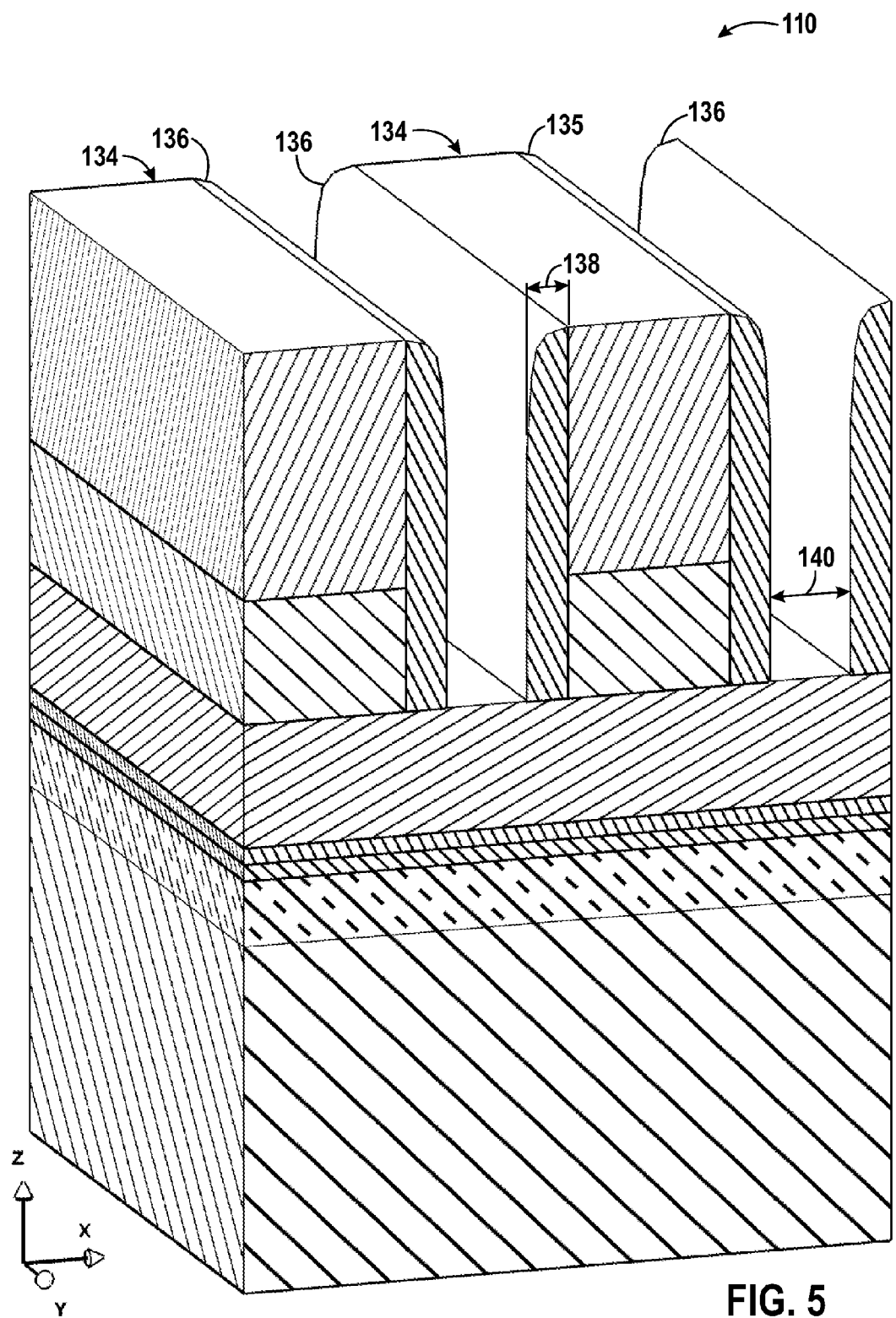

Next, the column mask 126 may be removed, and column spacers 136 may be formed on the sidewalls of the column hard mask 134 and lower masking body 122, as illustrated by FIG. 5. The column spacers 136 may be formed by depositing a generally conformal material (e.g., a material that forms a generally uniform thickness over both vertical and horizontal structures) and then anisotropically etching that material to remove it from horizontal surfaces, thereby leaving material disposed against generally vertical surfaces on the substrate 110. The column spacers 136 may be made of an oxide, and they may have a width 138 that is less than 100 nm, e.g., generally equal to 36 nm. The column spacers 136 may narrow the area exposed by the column hard mask 134 to a width 140 that is less than or equal to F, e.g., generally equal to or less than ¾ F, ½ F, or ¼ F. This narrower width 140 may generally define the space between horizontally-adjacent, subsequently-formed transistors.

Figure 6:
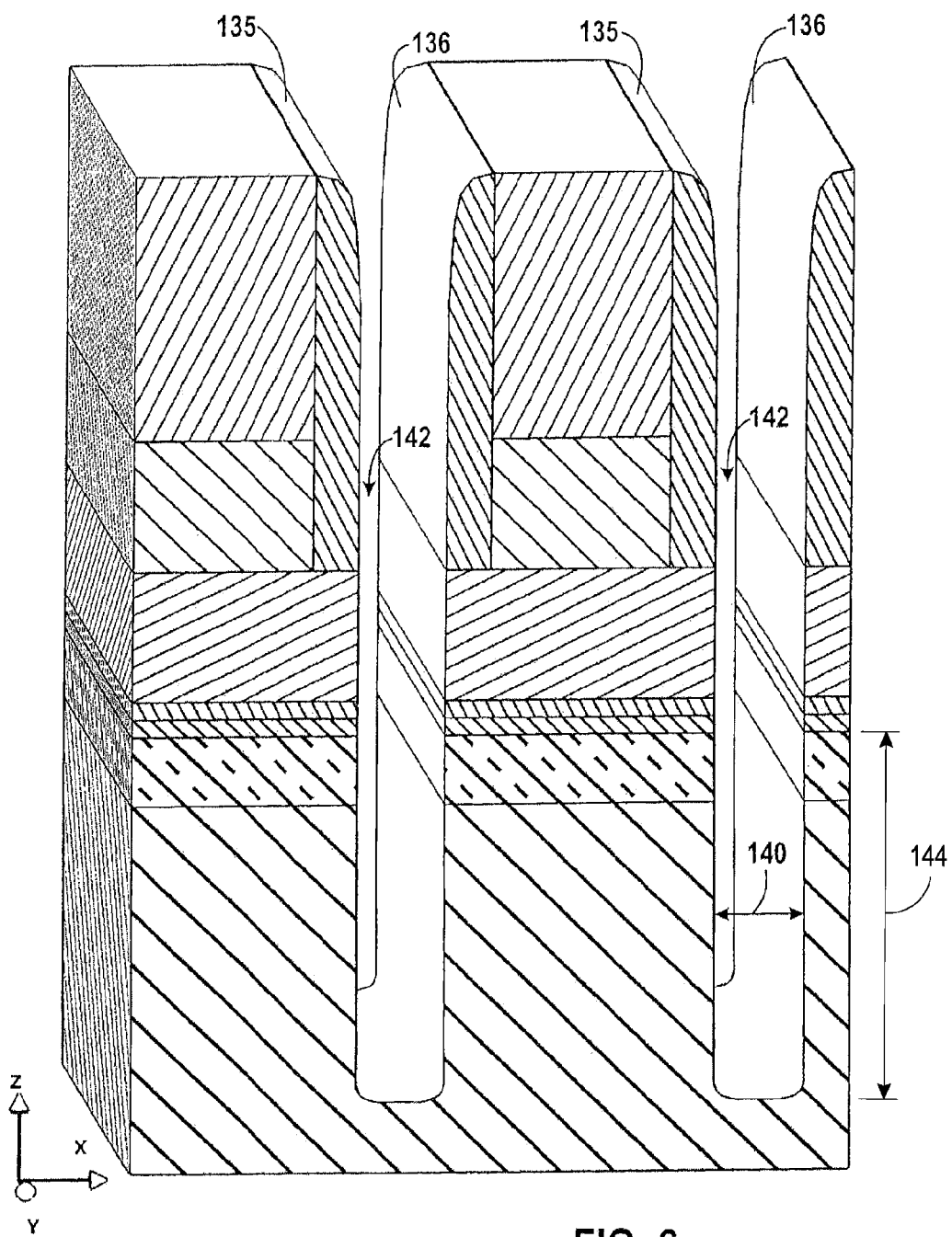

Next, as illustrated by FIG. 6, column isolation trenches 142 may be formed. The column isolation trenches 142 may be formed by generally anisotropically etching the exposed regions between the column spacers 136. The column isolation trenches 142 may have a width 140 that corresponds to (e.g., is equal to or proportional to) the width 140 (FIG. 5). The column isolation trenches 142 may generally extend in the Y direction and may be generally parallel to each other and generally straight (e.g., they lines may generally fall within a 4 F width). The cross-sectional shape of the column isolation trenches 142 may be generally uniform in the Y direction. In some embodiments, the column isolation trenches 142 may have a depth 144 that is between 500 Å and 5000 Å, e.g., generally equal to 2500 Å.

Figure 7:
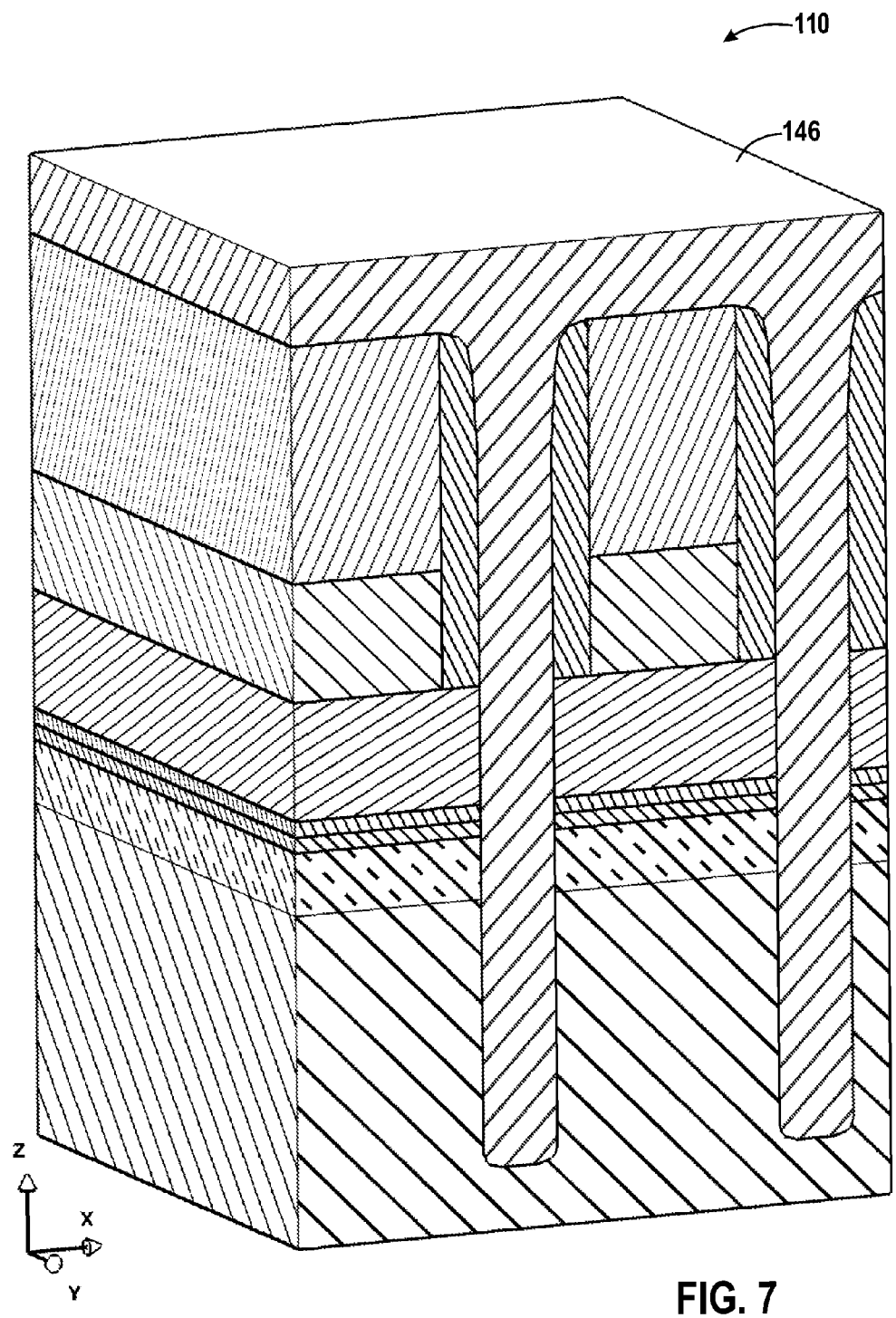

After forming the column isolation trenches 142, they may be filled partially or entirely with a dielectric 146, as illustrated by FIG. 7. The dielectric 146 may be made of a variety of materials, such as an oxide, and it may be lined with a variety of liner materials, such as an oxide liner or a nitride liner. In some embodiments, prior to forming the dielectric 146, the bottom of the column isolation trenches 142 may be implanted or diffused with a dopant selected to further electrically isolate structures on opposing sides of the column isolation trenches 142.

Figure 8:
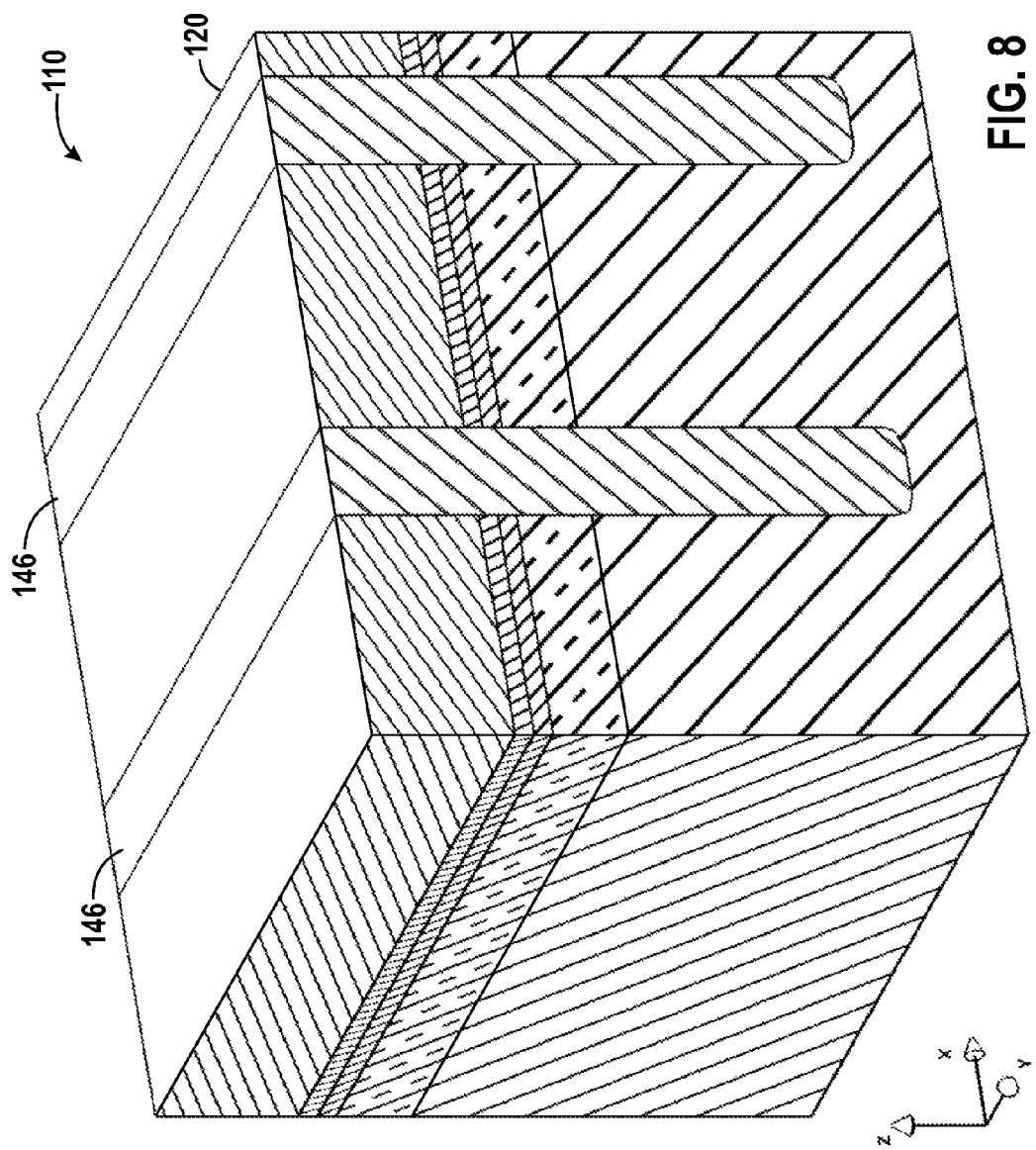

Next, the substrate 110 may be planarized, as illustrated by FIG. 8. Planarizing the substrate 110 may include etching the substrate 110 or polishing the substrate with chemical-mechanical planarization. Planarization may include removing both the upper masking body 124 and the lower masking body 122, and the process may stop on or in the sacrificial body 120. Additionally, an upper portion of the dielectric 146 maybe removed.

Figure 9:
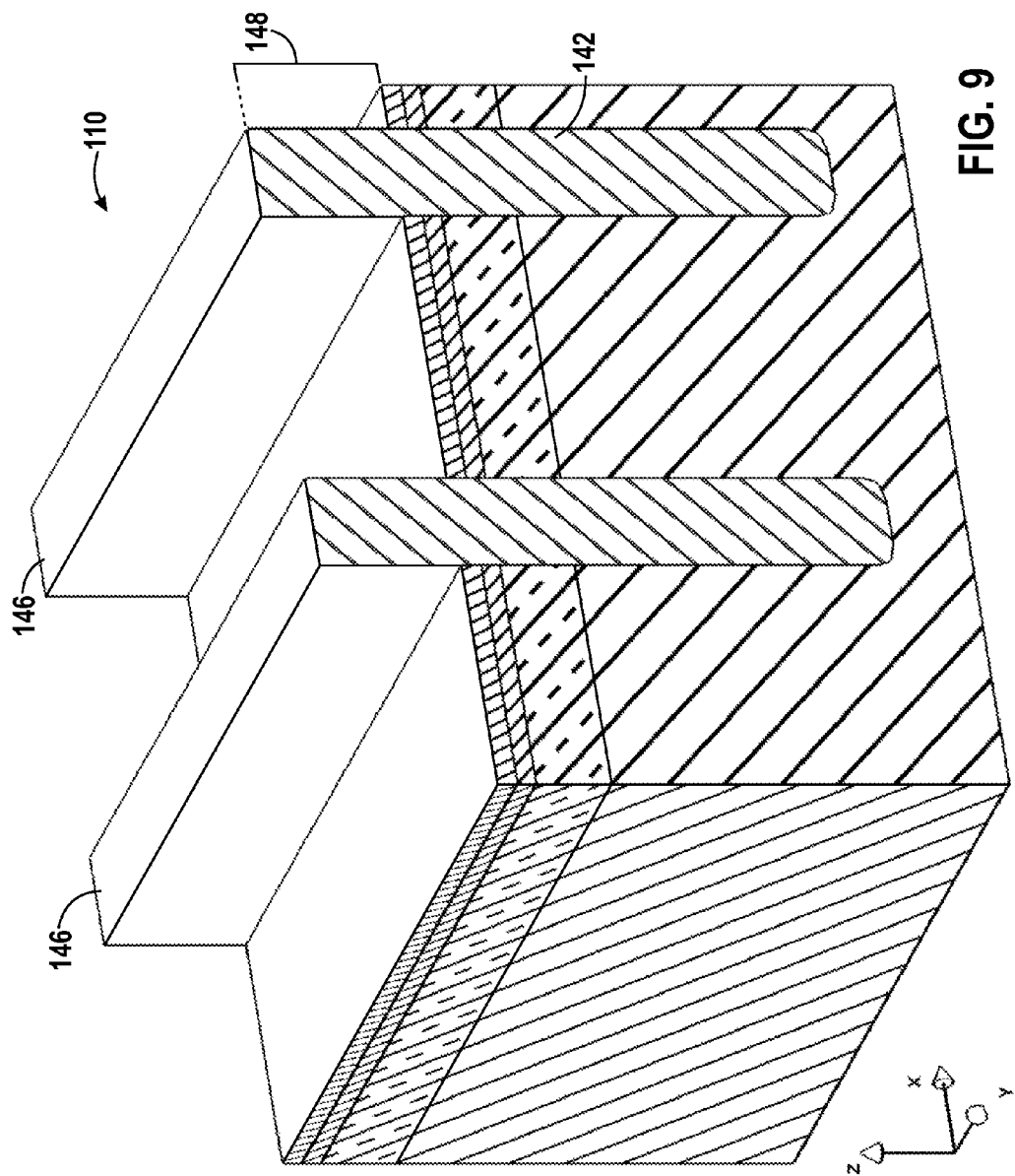

Next, the sacrificial body 120 may be partially or entirely removed, as illustrated by FIG. 9. Removal of sacrificial body 120 may include selective wet or dry etching selective to the sacrificial body 120. After removing the sacrificial body 120, generally vertical projections 148 of the dielectric 146 may extend from the substrate 110. These generally vertical projections 148 may be used to form self-aligned gate trenches between the column isolating trenches 142.

Figure 10:
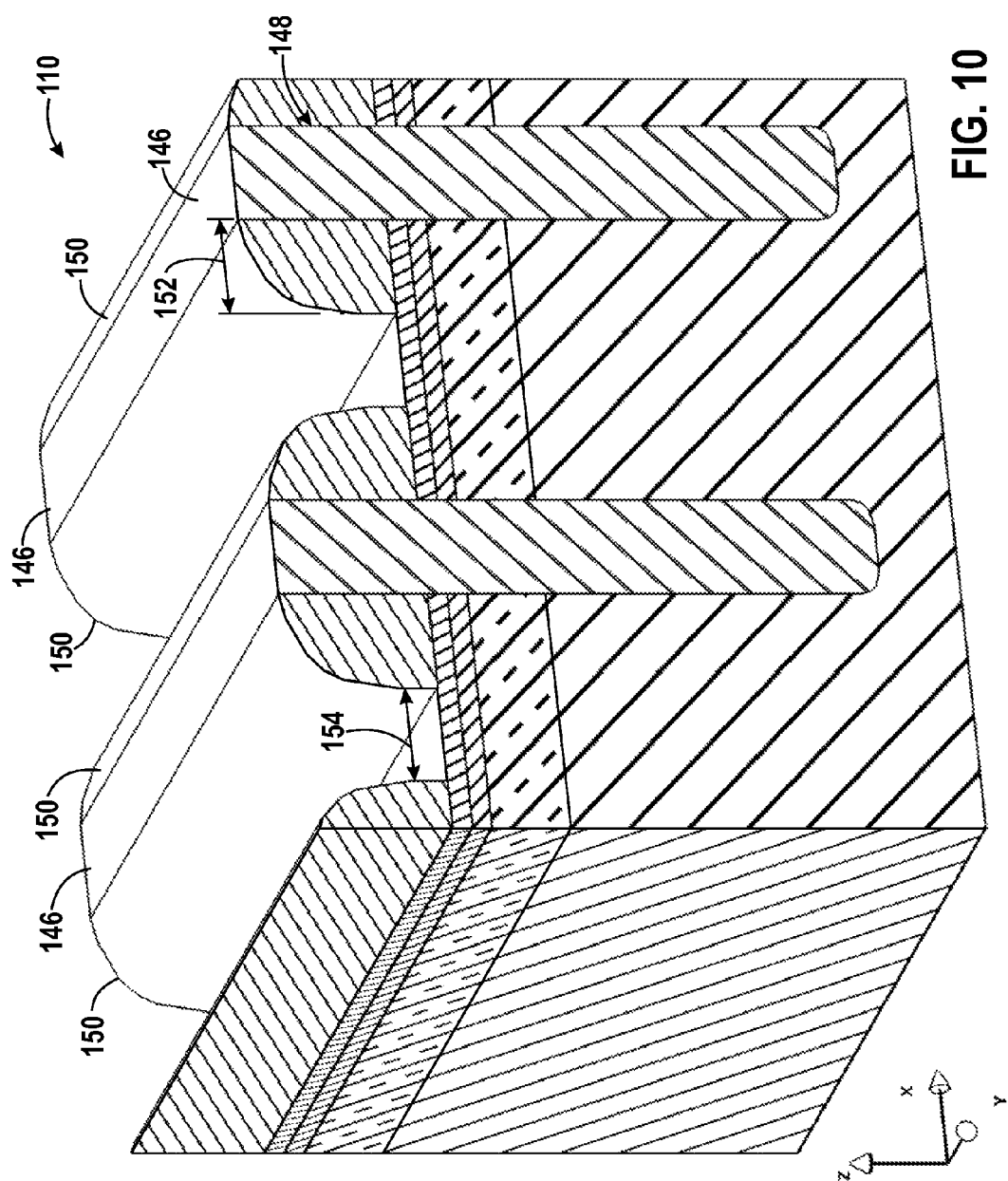

Next, a second group of column spacers 150 may be formed on the sidewalls of the generally vertical projections 148, as illustrated by FIG. 10. As with the previously described column spacers 136, the column spacers 150 may be formed by depositing a generally conformal material on the substrate 110 and anisotropically etching the material so that it is generally removed from the horizontal surfaces, leaving the material on the vertical surfaces on the substrate 110. The second group of column spacers 150 may, in some embodiments, be made of the same material as the dielectric 146, e.g., oxide, or they may be made of a different material. The second group of column spacers 150 may have a width 152 that is less than or generally equal to 100 nm, e.g., less than or generally equal to 36 nm. The spacers 150 may define a space having a width 154 between adjacent spacers 150 that is generally less than or equal to 1 F, ¾ F, ½ F, or ¼ F. Width 154 may generally define the width and position of a subsequently-formed column gate.

Figure 11:
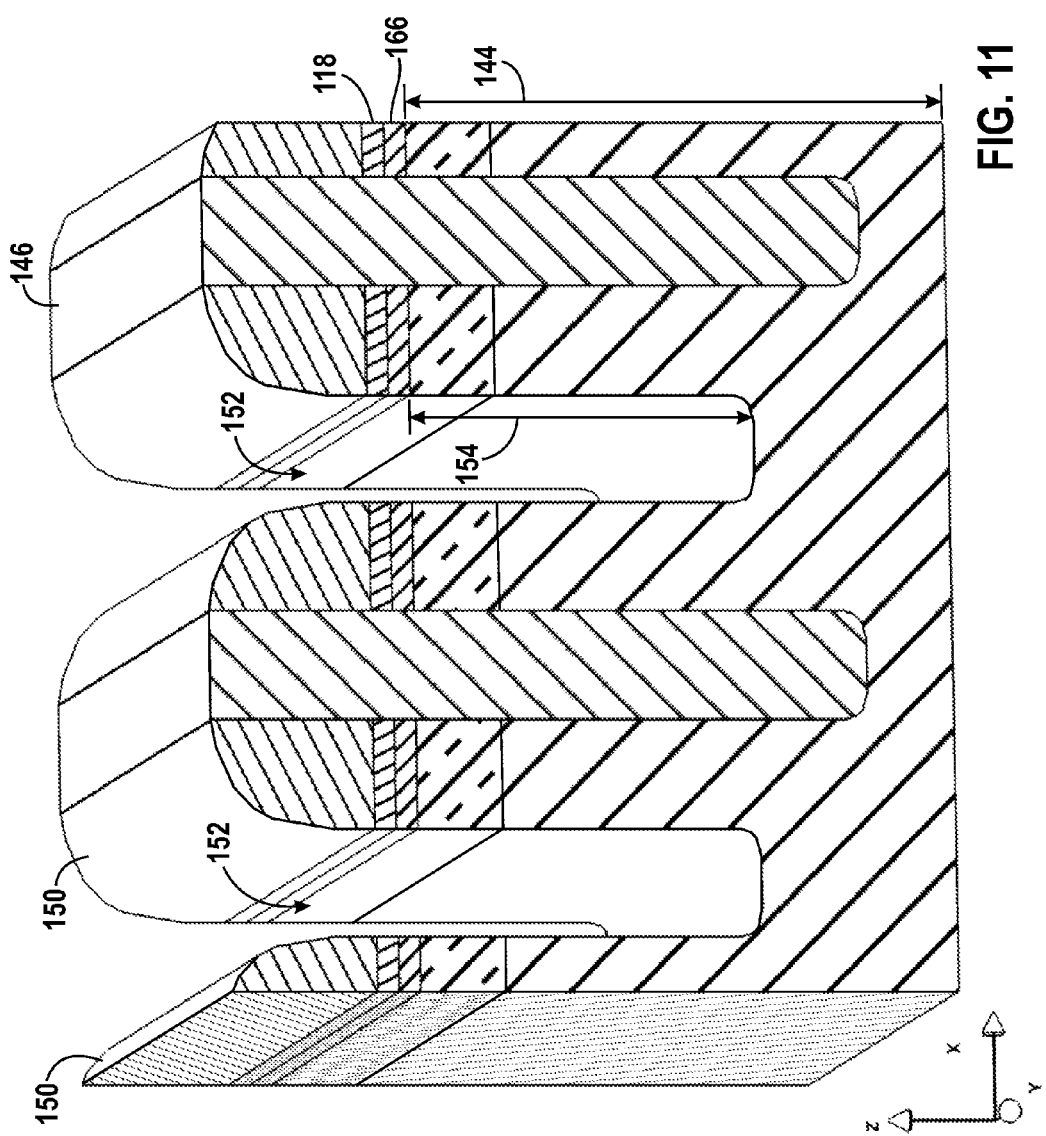

After forming the second group of column spaces 150, the column-gate trench 152 may be formed, as illustrated by FIG. 11. The column-gate trench 152 may be formed by generally anisotropically etching the exposed regions of space 154. The column-gate trenches 152 may be generally parallel to each other and the column isolation trenches 142, and they may generally extend in the Y direction. The column-gate trenches 152 may have a depth 154 that is less than the depth 144 of the column isolation trenches 142.

In some embodiments, a portion of the etch that forms the column isolation trenches 142 may be used to form other structures on the substrate 110. In some embodiments, these other structures may have a depth that is different from the depth of the column isolation trenches 142. For example, prior to etching the column-gate trench 152, a periphery portion of the substrate 110 may be masked. Then, a top portion of the column-gate trench 152 may be etched. Next, the periphery portion of the substrate 110 may be exposed, and the rest of the column-gate trench 152 may be etched, thereby exposing the periphery to a portion of the etch that forms the column-gate trench 152. Covering a portion of the substrate 110 during a portion of this etch may produce trenches in the periphery that are shallower than the column-gate trench 152.

Figure 12:
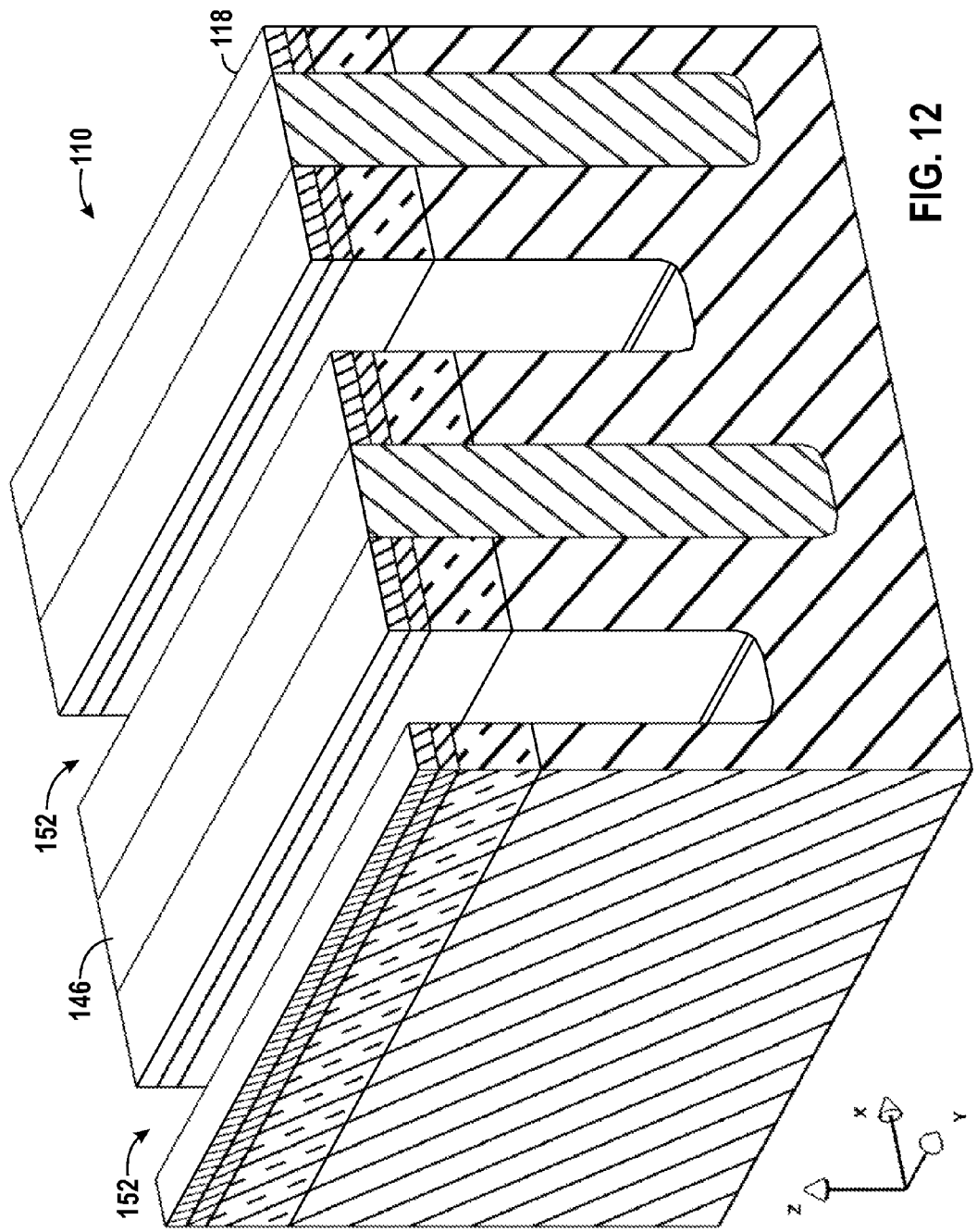
Figure 13:
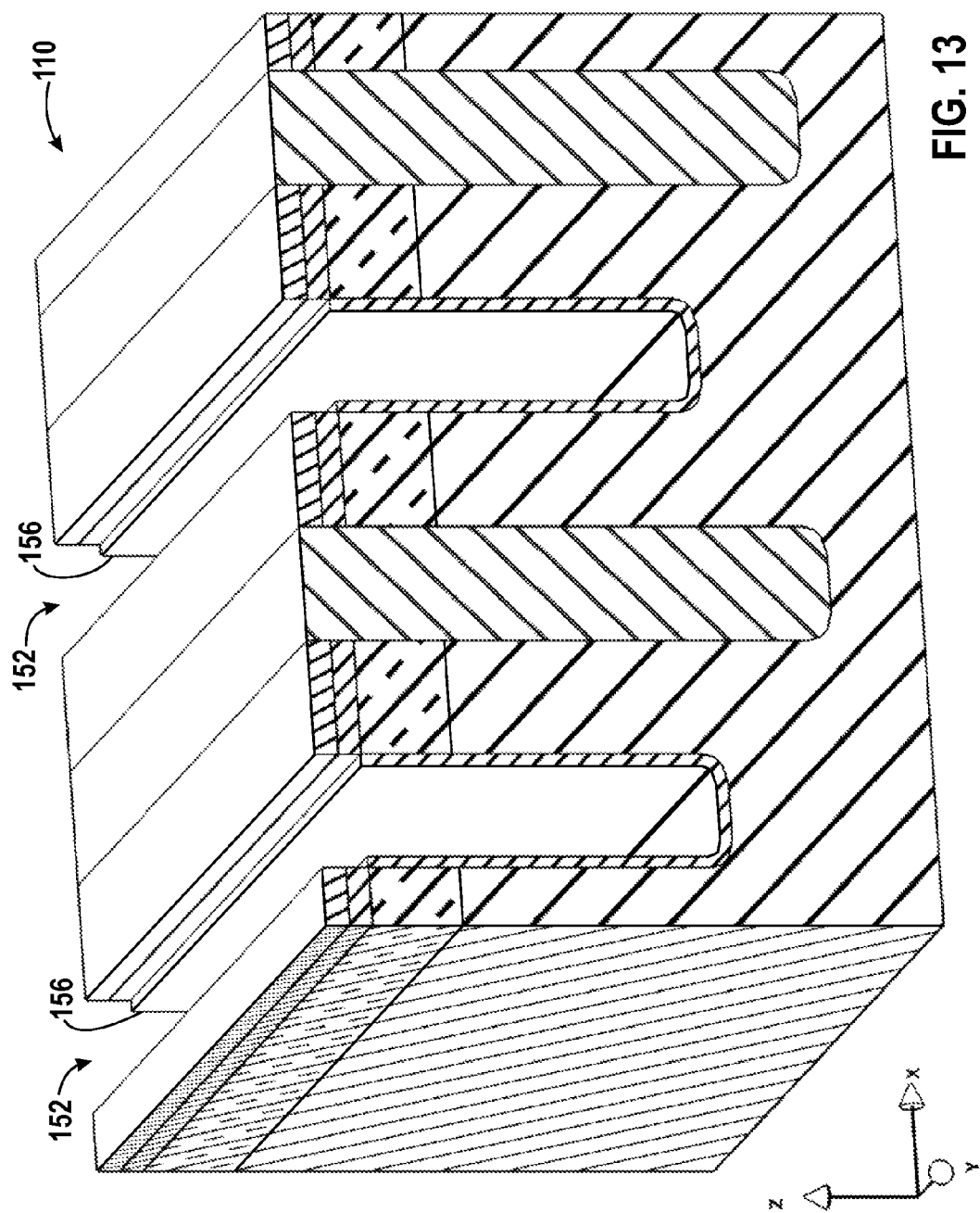

Next, the substrate 110 may be planarized, as illustrated by FIG. 12. Planarization may stop on or in the stop body 118, removing the second group of column spacers 150 and the vertical projections 148 in the process. In some embodiments, planarization is accomplished with chemical-mechanical planarization.

After planarizing the substrate 110, a column-gate dielectric 156 may be formed in the column-gate trenches 152. The column-gate dielectric 156 may be grown or deposited, and it may be made of a variety of dielectric materials, such as oxide (e.g., silicon dioxide), oxynitride, or high-dielectric constant materials like hafnium dioxide, zirconium dioxide, and titanium dioxide. As explained below, this column-gate dielectric 156 may form the gate dielectric for a lower transistor associated with each subsequently-formed data cell.

Figure 14:
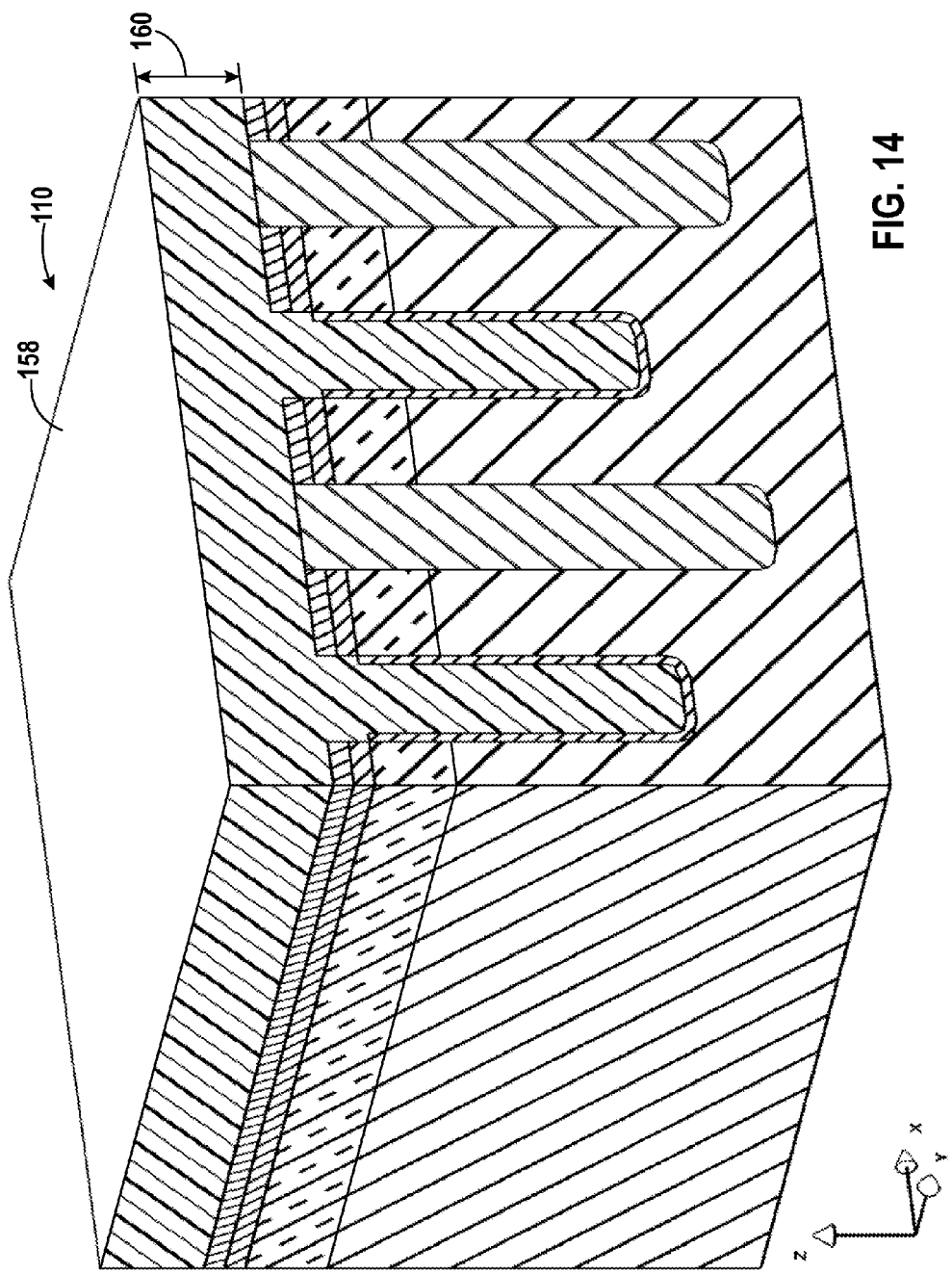

Next, a column-gate material 158 may be formed on the substrate 110, as illustrated by FIG. 14. The column-gate material of 158 may be a conductive material, such as a metal or polysilicon, and it may be deposited with an overburdened 160 to increase the likelihood of filling the column-gate trenches 152 and to planarize the surface.

Figure 15:
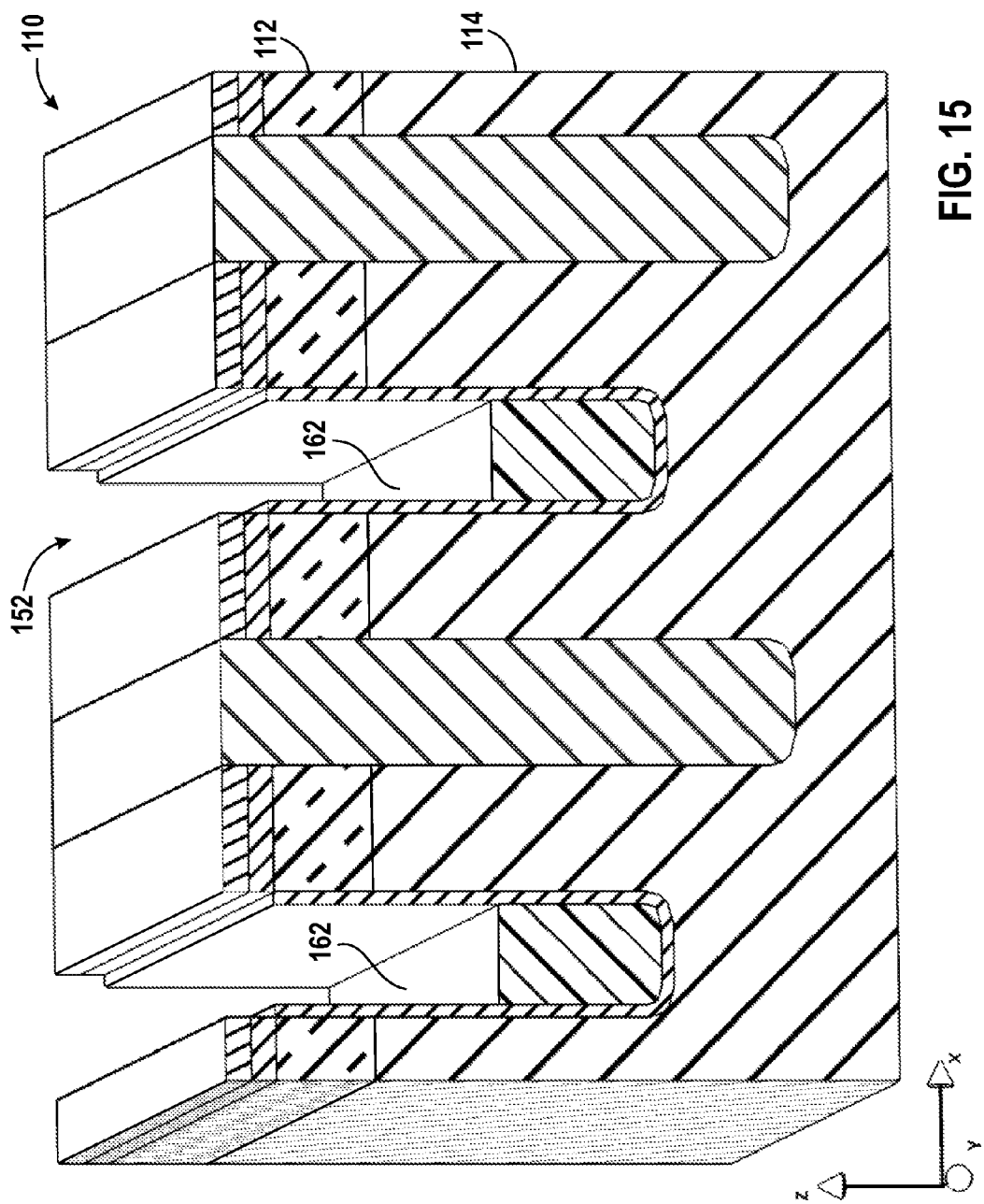

After forming the column-gate material 158, a portion of this material 158 may be removed to form column gates 162, as illustrated by FIG. 15. The column gates 162 may be formed by recessing the column-gate material 158 with a wet or dry etch below the surface of the substrate 110 and into the column-gate trenches 152. In some embodiments, the column gates 162 may be recessed below the bottom of the upper doped region 112, or in other embodiments, the column gates 162 may overlap a portion of the upper doped region 112. In this embodiment, each of the illustrated column gates 162 may be electrically isolated from one another, but in other embodiments, some or all of them may be connected to one another. As explained below, the column gates 162 may establish an electric field that forms a channel around the bottom portion of the column-gate trenches 152, and this channel may connect to the upper doped region 112 through another channel established by subsequently-formed gates associated with upper transistors.

Figure 16:
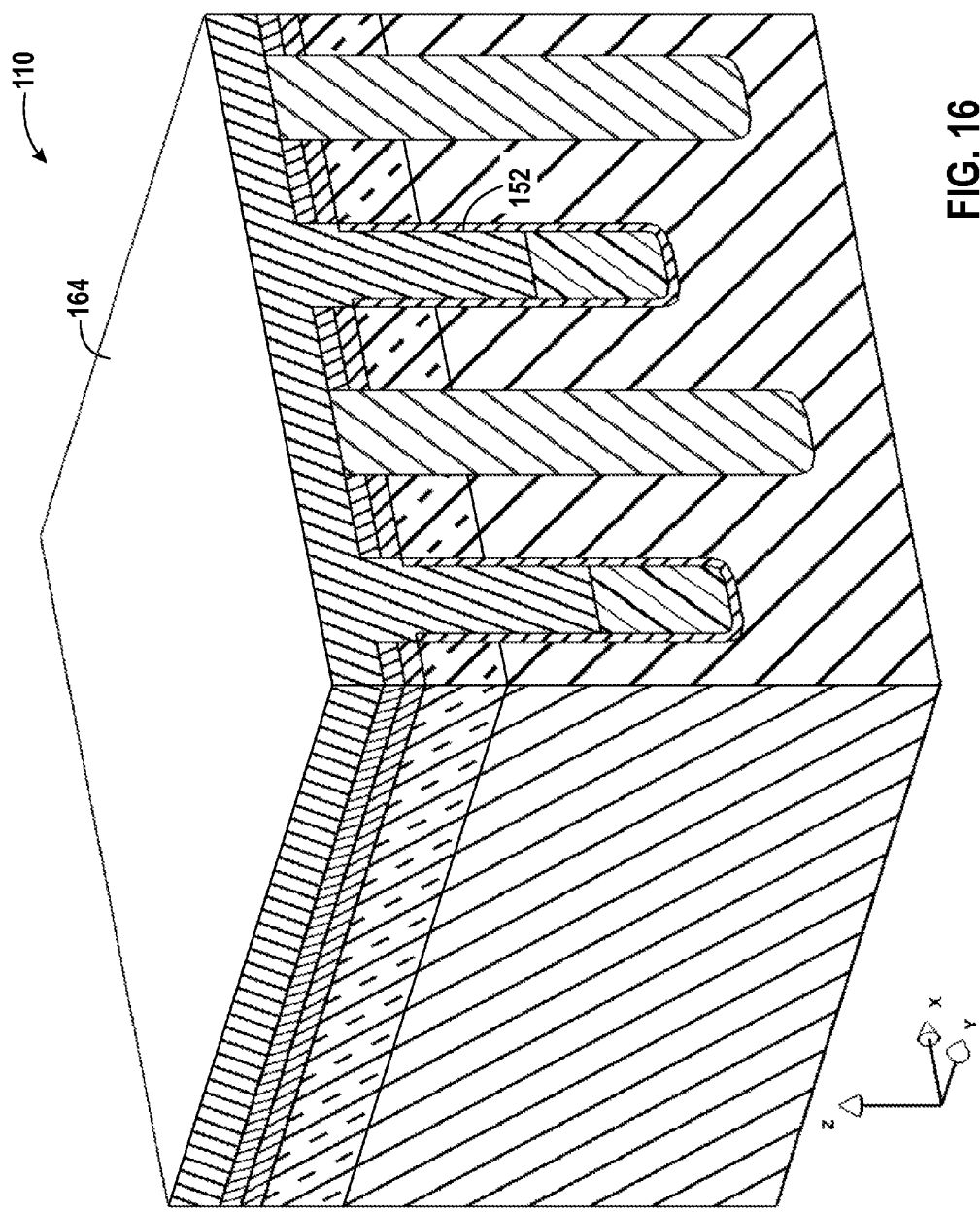

Next, a protective body 164 may be formed on the substrate 110, as illustrated by FIG. 16. In some embodiments, the protective body 164 is a nitride material that generally fills the remainder of the column-gate trench 152 and covers the substrate 110. This body 164 may protect the existing structures that generally extend in the Y direction while the following process steps form structures that generally extend in the X direction.

Figure 17:
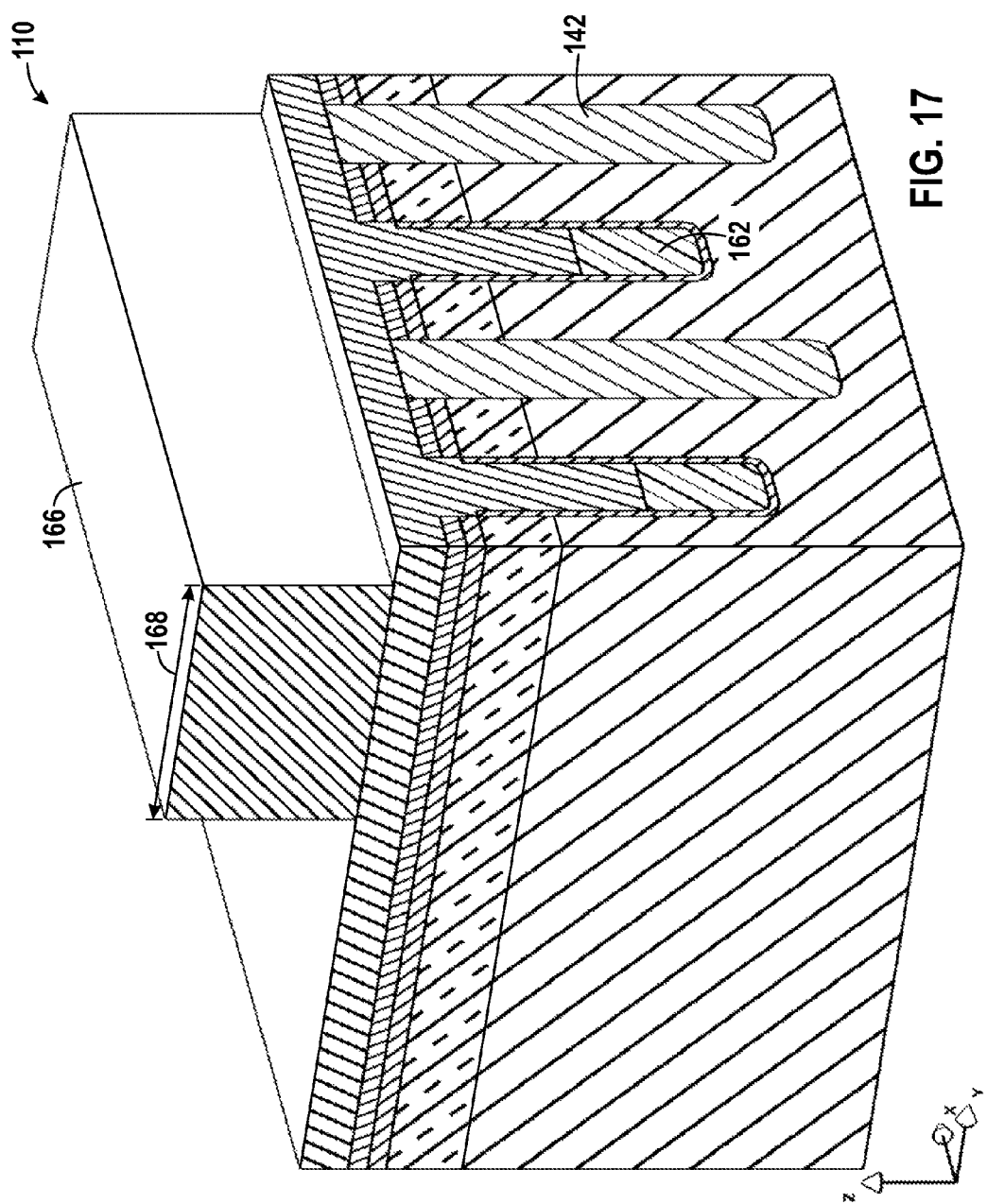

As illustrated by FIG. 17, next, a row mask 166 may be formed with photolithography or other patterning processes. The row mask 166 may be a hard mask or a soft mask, and it may generally extend in the X direction, generally perpendicular to both the column gates 162 and the column isolation trenches 142. The row mask 166 may define mask regions with a width 168 that is generally equal to or less than 1 F, 1.5 F, 2 F, 3 F, or some other distance. Although FIG. 17 only illustrates a single row mask 166, a plurality of row masks 166 may be included that are generally parallel to one another, generally straight, and may have a generally uniform cross section in the X direction. Row mask 166 may be generally continuous and generally uniform in the X direction over a substantial distance, e.g., a distance larger than 20 F. In other embodiments, though, the row mask 166 may form lines that are not straight (e.g., undulating up and down, left and right, or both), are not of uniform width, are not continuous, or are not generally orthogonal to the column gates 162.

Figure 18:
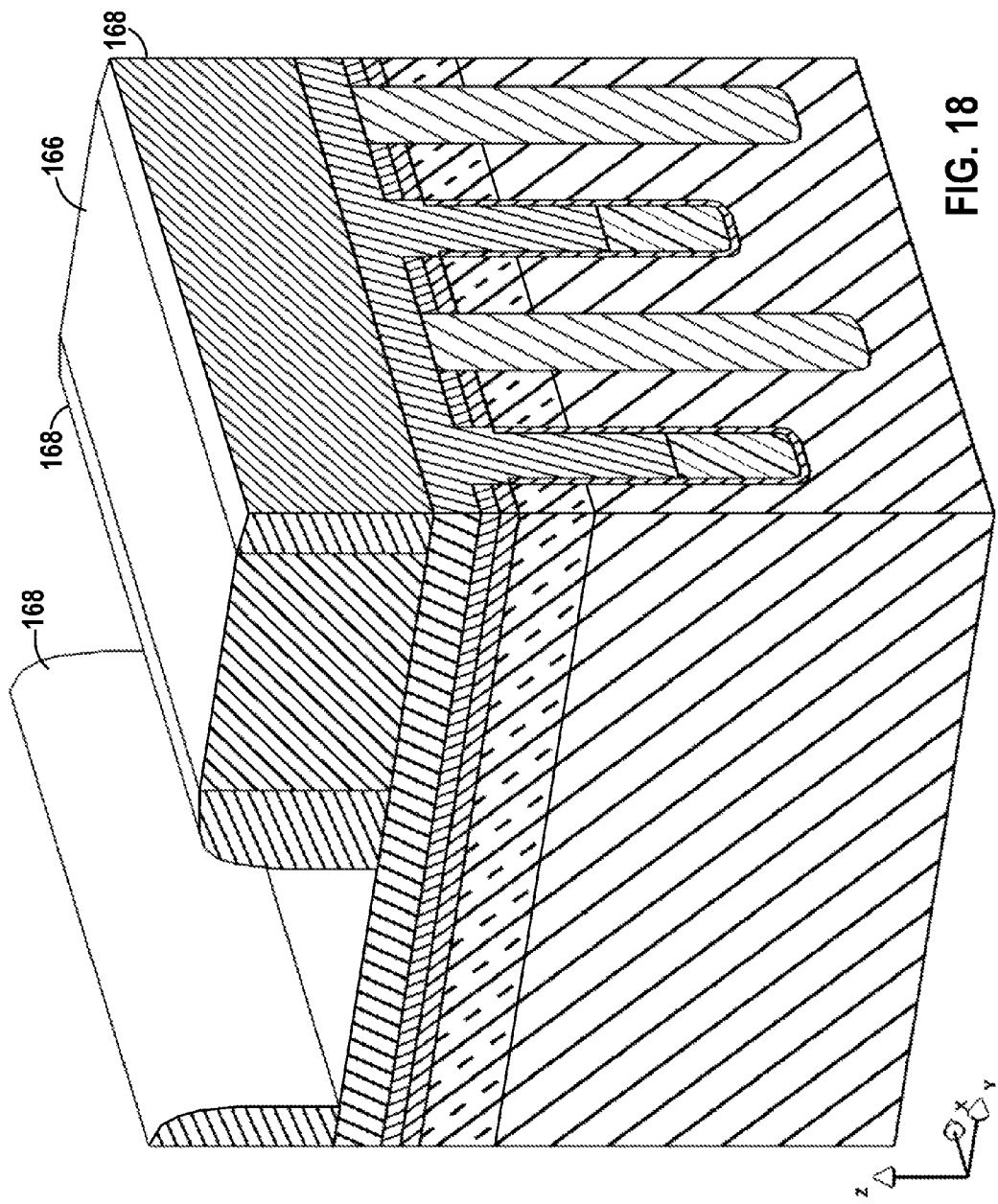
Figure 19:
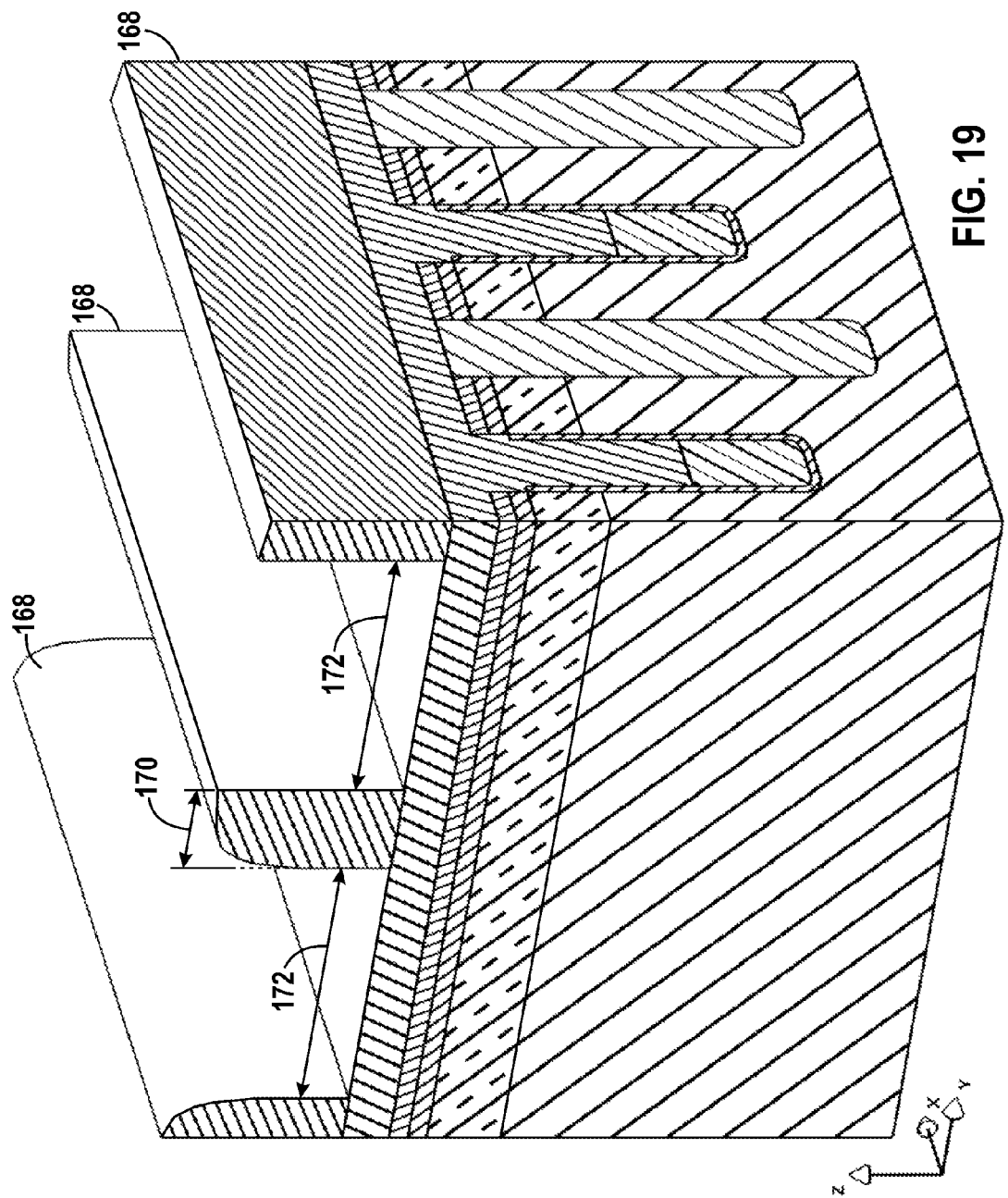

In some embodiments, the row mask 166 may be double pitched with the steps illustrated by FIGS. 18 and 19. (The term "pitch" refers to the distance over which a pattern repeats in photolithography and other semiconductor patterning processes.) As illustrated by FIG. 18, a row spacer 168 may be formed on the sidewalls of the row mask 166. The spacer 168 may be formed with a process similar to the spacers 136 and 150 described above. The spacer 168 may be made of a different material from the row mask 166 to facilitate selective removal of the row mask 166. Next, the row mask 166 may be removed after forming the row spacers 168, as illustrated by FIG. 19. The row spacers 168 may have a width 170 that is generally equal to or less than 1 F, ¾ F, ½ F, or ¼ F, and they may be separated from one another by a width 172 that is generally equal to the width 168 of the row mask 166.

Figure 20:
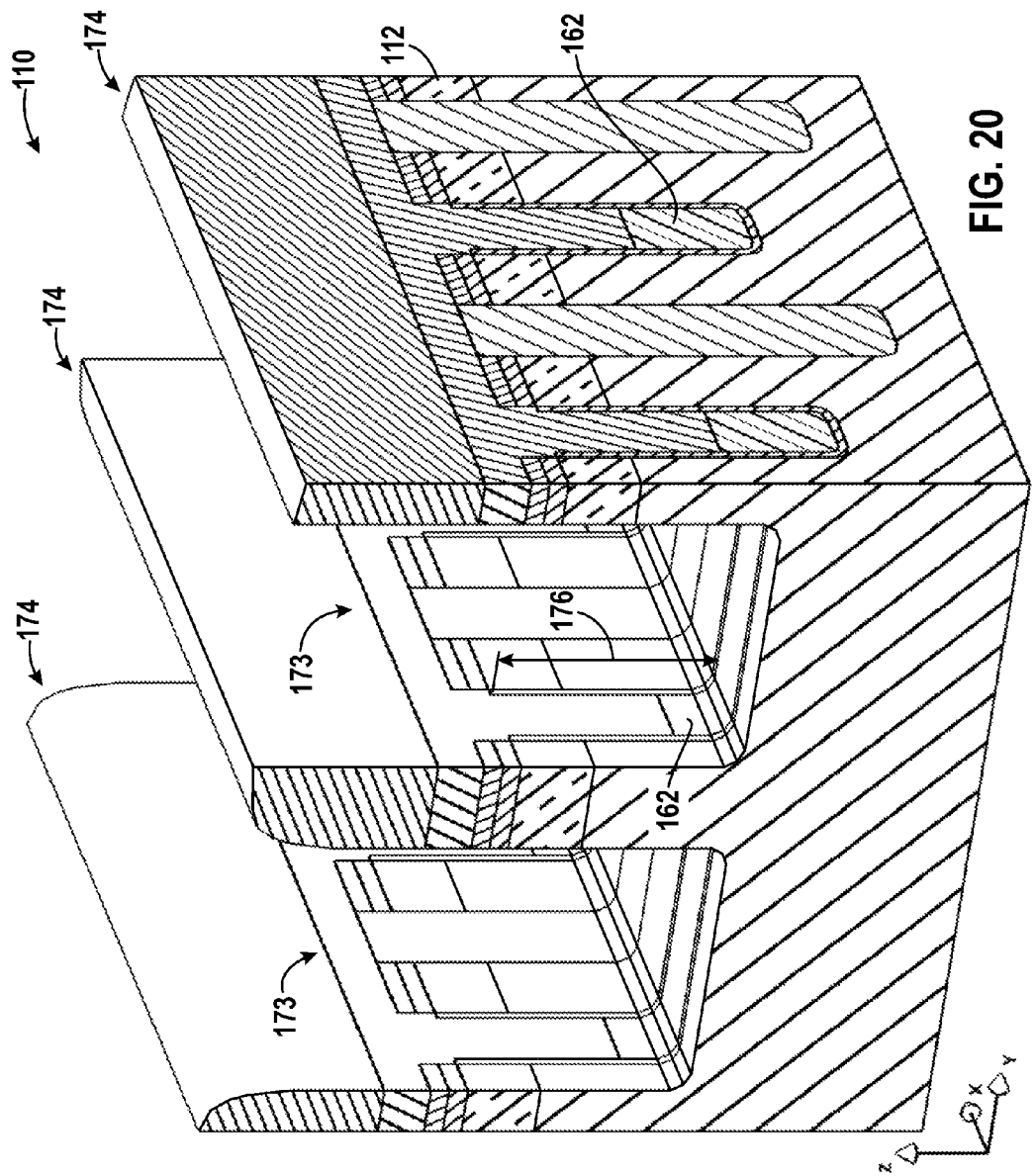

Next, row-gate trenches 173 may be formed, thereby defining fin rows 174, as illustrated by FIG. 20. The illustrated fin rows 174 may be formed by generally anisotropically etching the regions of the substrate 110 left exposed by removal of the row spacers 168. The etch may reach a depth 176 below the top of the upper doped region 112 into substrate 110. In some embodiments, this distance 176 may place the bottom of the row-gate trenches 173 below the top of the column gates 162 so that the fin rows 174 overlap the column gates 162. The illustrated fin rows 174 may define a generally cuboid volume (though its sides may be sloped, curved, or both) that generally extends in the X direction, generally perpendicular to the column gates 162. The illustrated fin rows 174 may be generally straight and generally parallel to one another.

Figure 21:
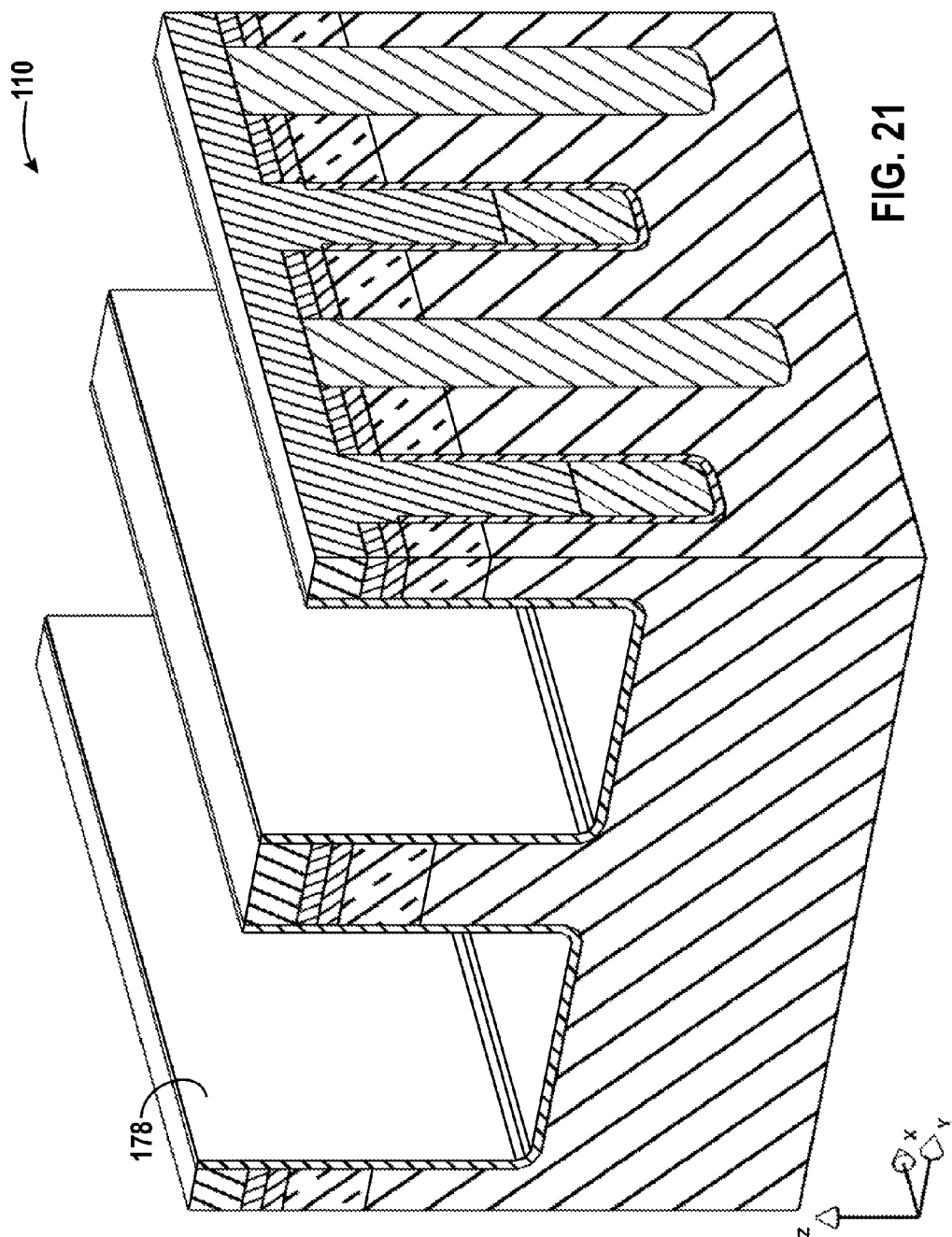

Next, a row-gate dielectric 178 may be formed on the substrate 110, as illustrated by FIG. 21. The row-gate dielectric 178 may be deposited or grown, and it may include one or more of the dielectric materials discussed above with reference to the column-gate dielectric 156.

Figure 22:
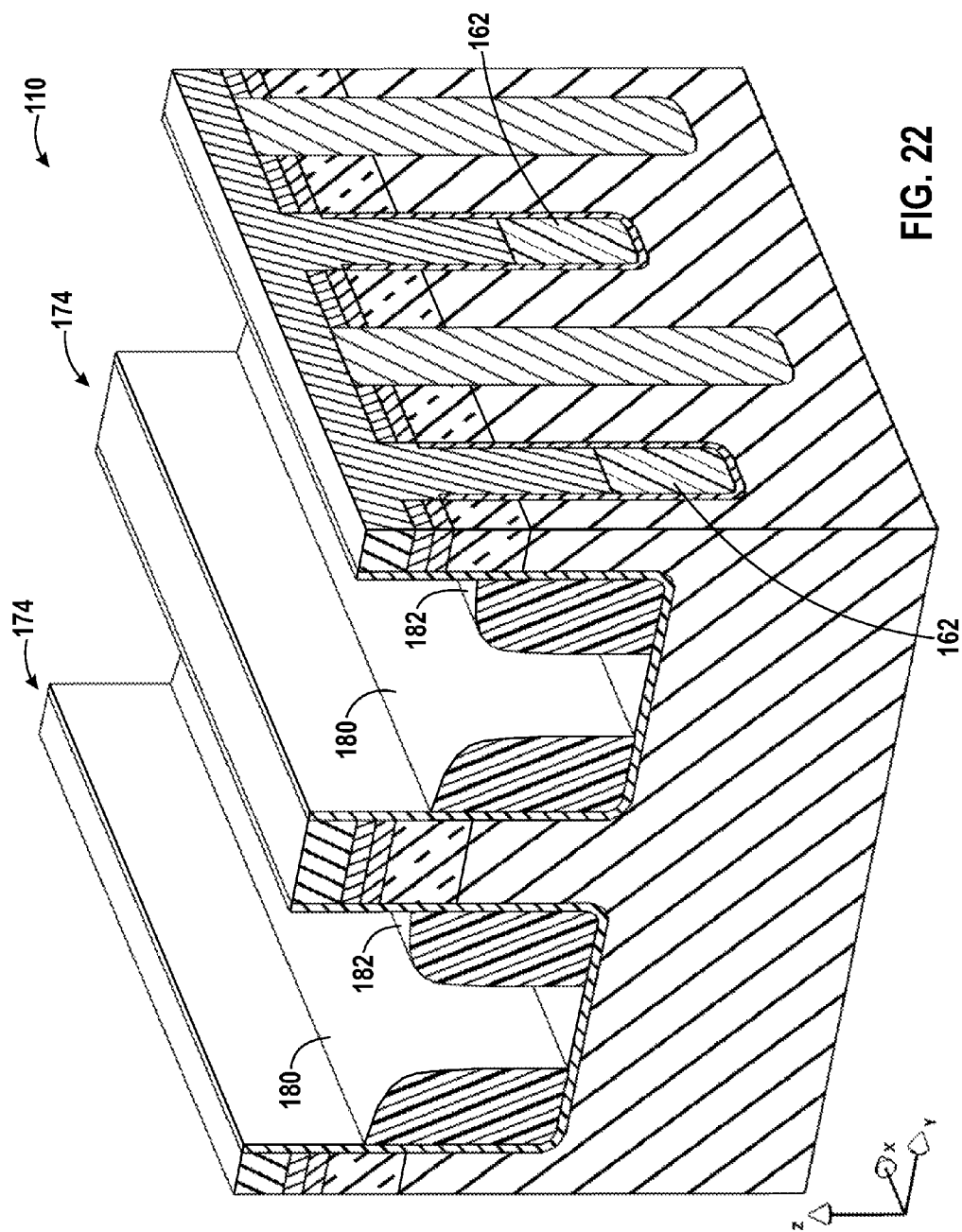

After forming the row-gate dielectric 178, row gates 180 and 182 may be formed, as illustrated by FIG. 22. In this embodiment, the row gates 180 and 182 may be formed with a sidewall spacer process. A conductive material, such as TiN, may be deposited on the substrate 110 and, then, anisotropically etched to leave a conductive sidewall spacer 180 or 182 on either side of each fin row 174. The row gates 180 and 182 may extend from the upper doped region 112.

Figure 23:
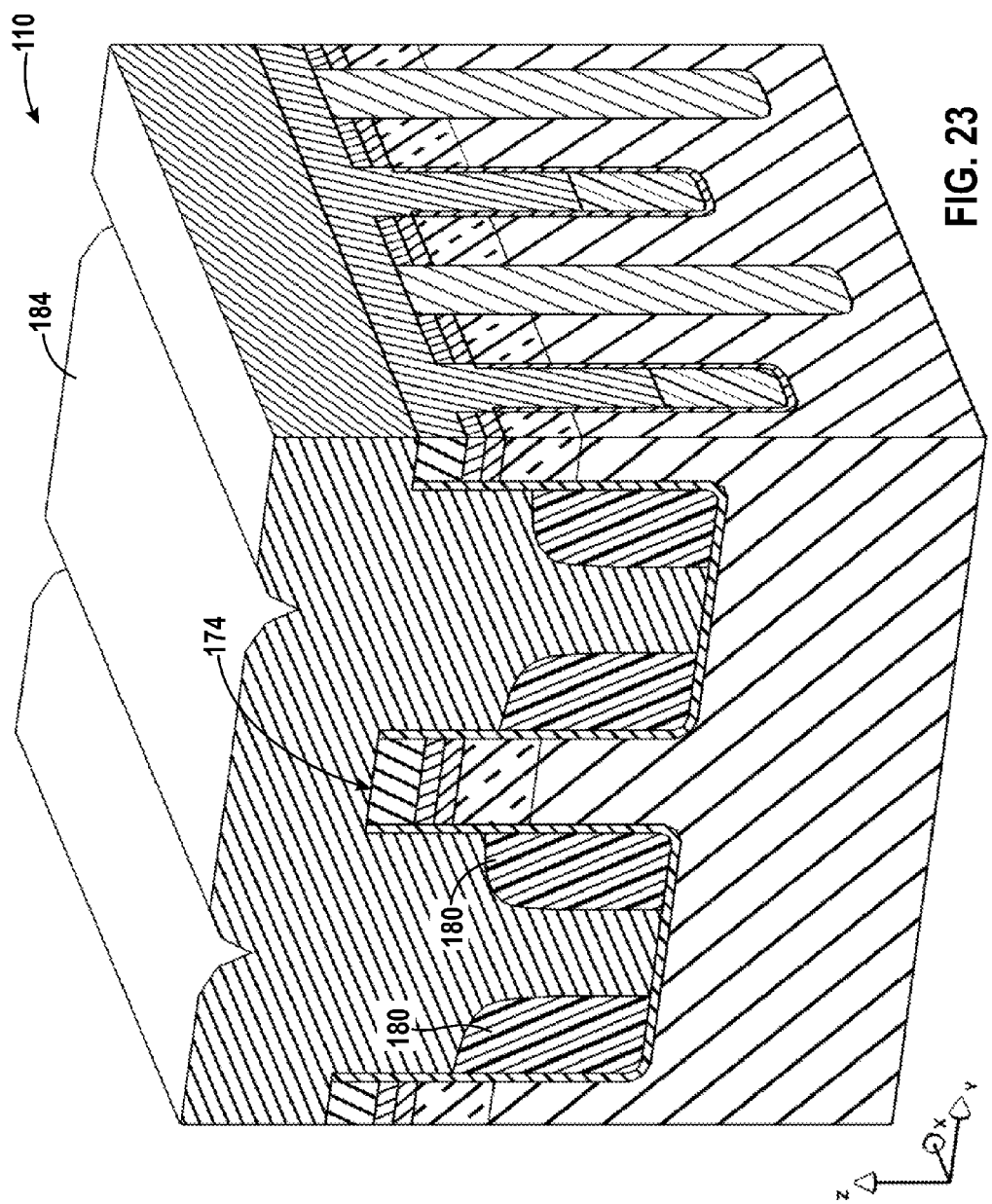

Next, a protective dielectric material 184 may be formed on the substrate 110, as illustrated by FIG. 23. The dielectric material 184 may be an oxide, nitride, or other appropriate material, and it may isolate gates 180 and 182 associated with adjacent fin rows 174.

Figure 24:
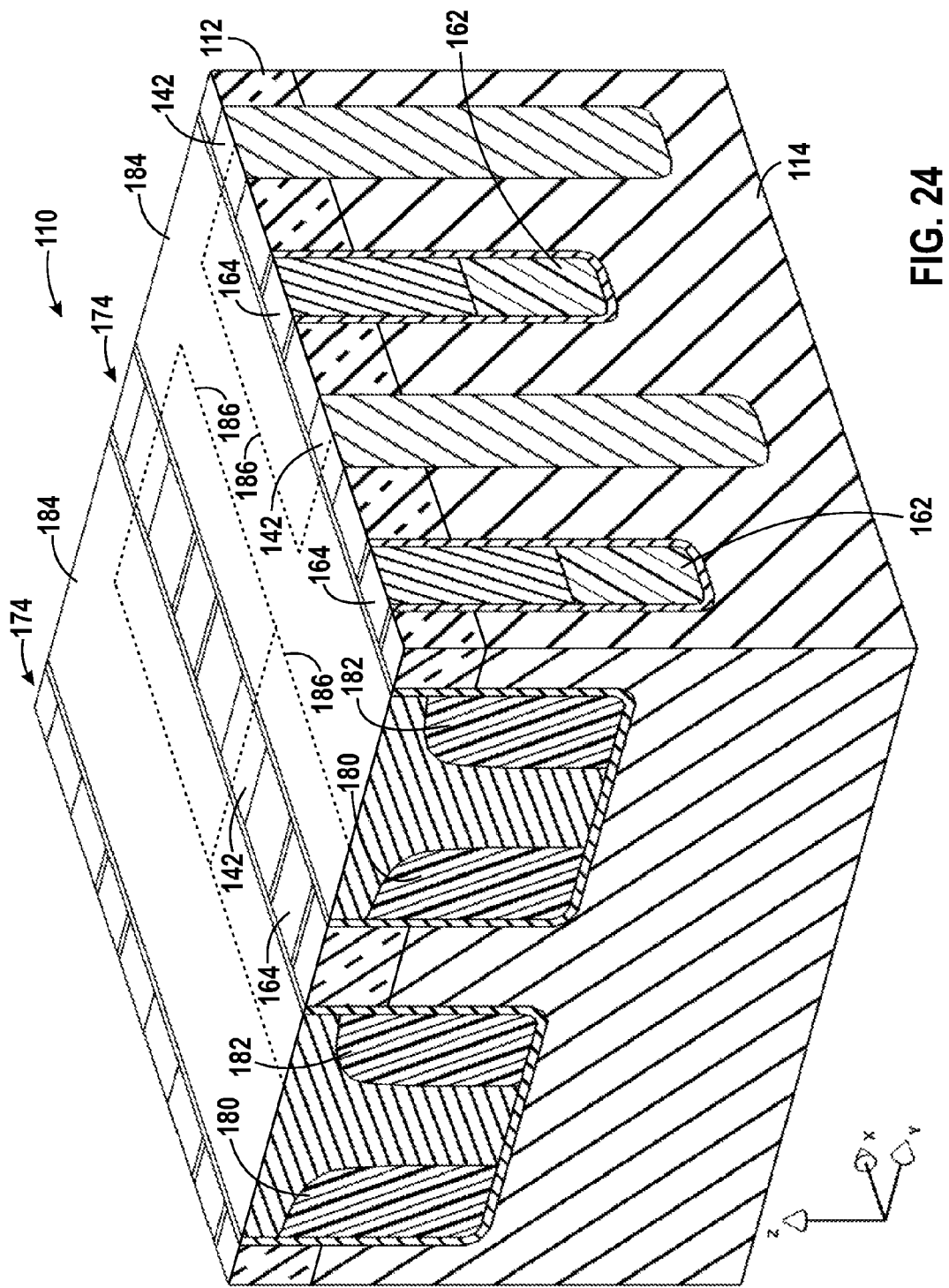

To complete the portion of the process that forms transistors, in some embodiments, the substrate 110 may be planarized, as illustrated by FIG. 24. The substrate 110 may be planarized with an etch or chemical-mechanical planarization. In some embodiments, planarization exposes the top portion of the upper doped region 112 for establishing electrical contact with subsequently-formed data lines and data elements.

The above-disclosed process may produce an array of cells each with a pair of stacked transistors. The resulting array is illustrated by the perspective view of FIG. 24 and the elevation views of FIGS. 25 and 26. The silicon portion of each cell in this embodiment is illustrated by FIG. 27, and aspects of an individual cell are illustrated by FIGS. 28-30. These figures are addressed below.

Figure 25:
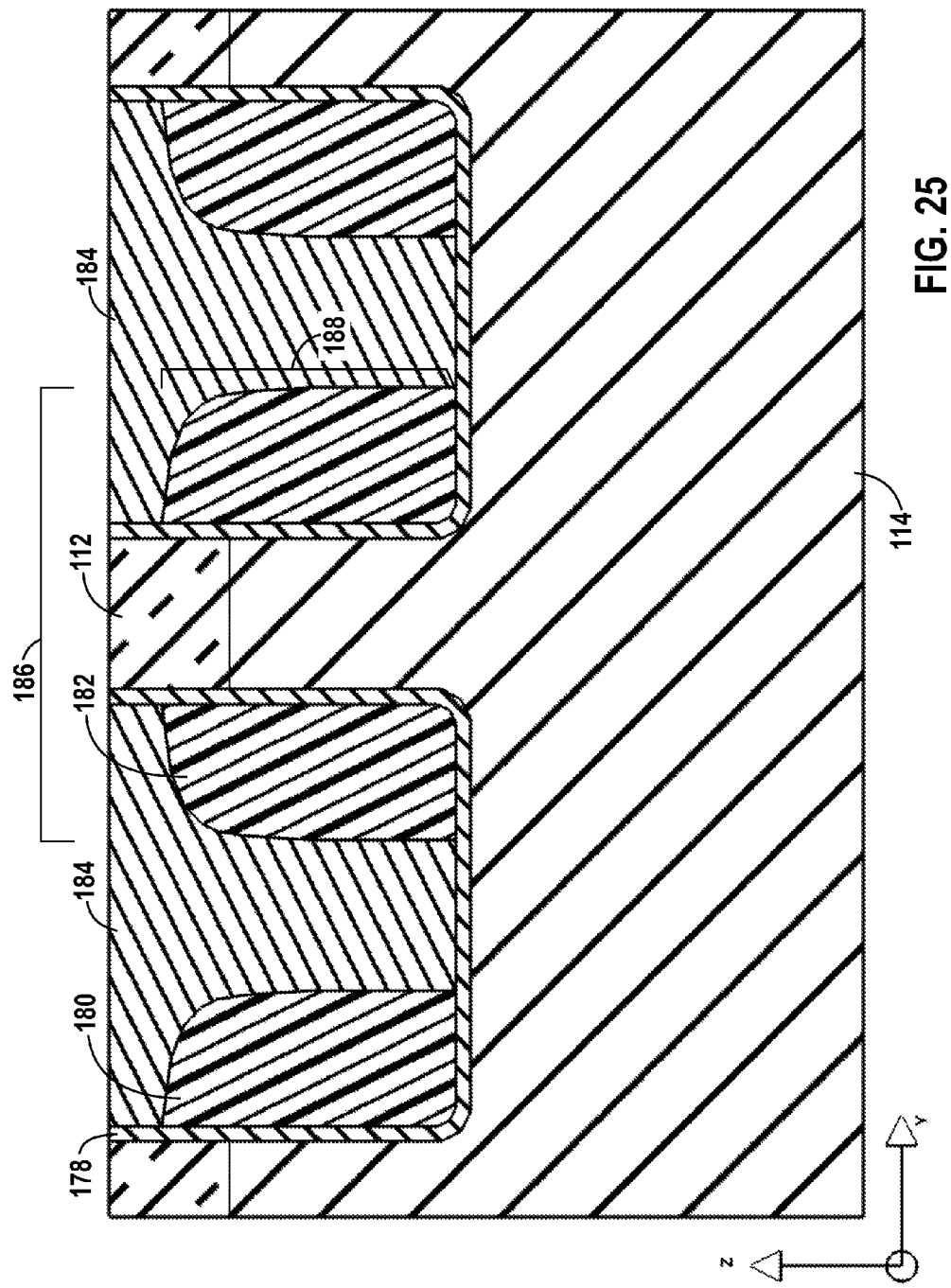
Figure 26:
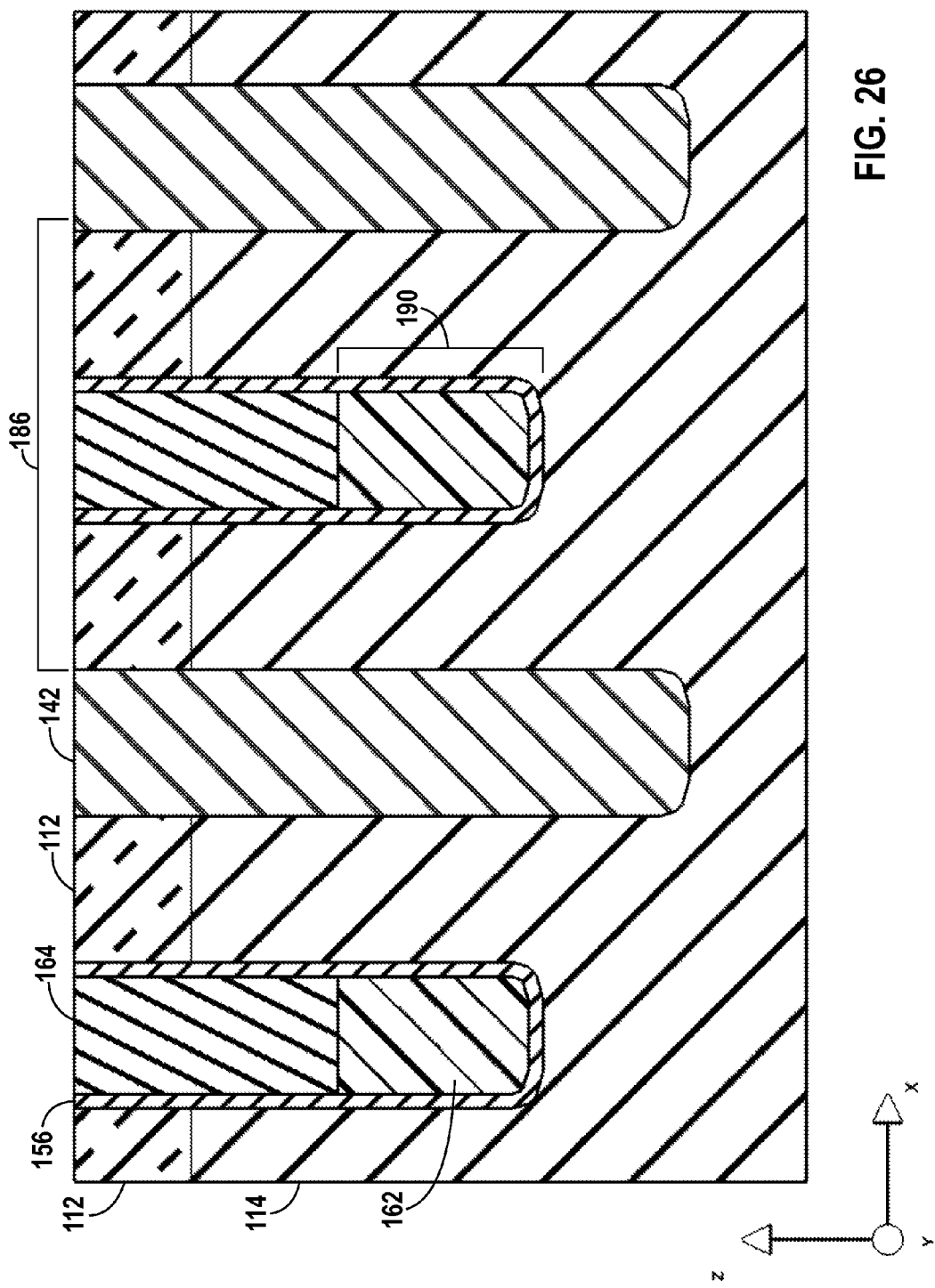

FIG. 24-26 illustrate an array of cells 186 that each include an upper transistor 188 (FIG. 25) and a lower transistor 190 (FIG. 26). The illustrated cells 186 are generally arranged in a rectangular lattice, with rows defined by the fin rows 174, and columns defined by the column gates 162. In other embodiments, the cells 186 may be arranged differently, e.g., in an oblique lattice or in a hexagonal lattice with offset adjacent rows or columns. In some embodiments, each cell 186 may consume a horizontal area that is less than or generally equal to 10 $F^2$, 8 $F^2$, 6 $F^2$, or 4 $F^2$.

Figure 44:
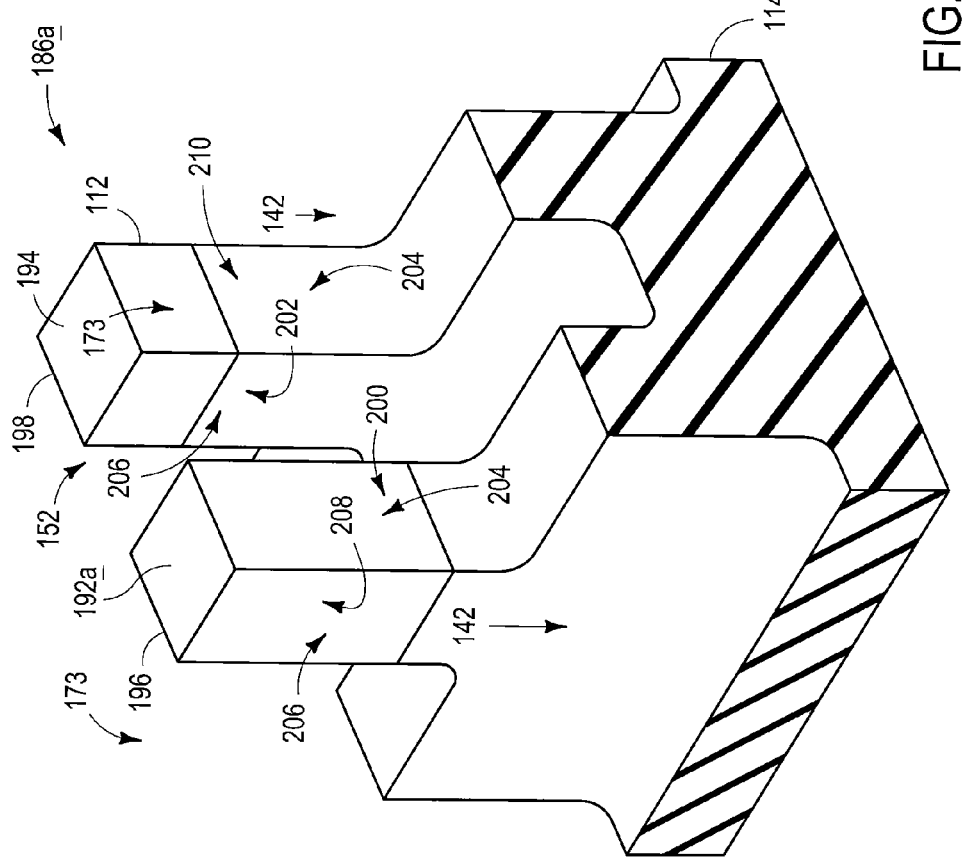

The semiconductive portion of an example of an individual cell 186 is illustrated by FIG. 27. In some embodiments, the cell 186 may include a source 192 and a drain 194, and each of these terminals may be disposed at a distal end of a leg 196 or 198 that extends generally vertically from the substrate 110. The source 192 and drain 194 may be formed by a portion of the legs 196 and 198 that are formed from the doped region 112. In some embodiments, the depth of the doped region 112 may vary over the substrate, and the legs 198 and 196 may have doped distal portions 192a and 194 of different length as shown in another example cell 186a in FIG. 44. The doped region 112 in the leg 196 may overlap both the gates 180 and 182 and the gate 162 to reduce the channel length.

Adjacent edges 200 and 202 of the legs 196 and 198 may be separated by the column-gate trench 152, and the legs' sides 204 and 206 may be generally defined by the row-gate trenches 173. The outer edges 208 and 210 of the legs 196 and 198 may be generally defined by the column isolation trenches 142.

Each pair of gates 180 and 182 may form an upper transistor, which may be disposed above a lower transistor formed with the column gates 162. Together, the upper and lower transistors may form a conductive channel between one portion of the upper doped region 112 and another portion of the upper doped region 112. These transistors and the resulting channel are described below with reference to FIGS. 28-30.

FIG. 28 illustrates the semiconductive portion of the cell 186 in relation to the column gate 162 and the row gates 180 and 182. The legs 196 and 198 may extend between the row gates 180 and 182, and the row gates 180 and 182 may cross over and partially overlap the column gate 162. The column gate 162 may extend between the legs 196 and 198.

In operation, the cell 186 controls current between the source 192 and the drain 194 in response to the voltage of the column gate 162 and of the row gates 180 and 182. When the voltages of both the column gate 162 and the row gates 180 and 182 are elevated (or, in some embodiments, lowered) relative to the voltage of the lower doped region 114, conductive channel 212 (FIG. 29) is created between the source 192 and the drain 194.

The shape of the channel 212 in this embodiment is illustrated in FIG. 29. The channel 212 may include an upper channel 214 and a lower channel 216 that overlap. The upper channel 214 may be established by the row gates 180 and 182, and the lower channel 216 may be established by the column gate 162. The upper channel 214 may generally define a pair of symmetric volumes that are generally uniform in the X direction, and the lower channel 216 may define a volume that is generally uniform in the Y direction. Depending on the direction of current and the embodiment, channel 212 may receive current through one side of the upper channel 214, as illustrated by arrows 218, and output the current through the other side of the upper channel 214, as illustrated by arrows 220. Between entering and exiting the channel 212, the current may flow through both the upper channel 214 and the lower channel 216.

As mentioned above, in some embodiments, the depth of the upper doped region 112 may be different in legs 196 and 198 (FIG. 28), and this may affect the shape of the channel illustrated by FIG. 29. In some embodiments, the upper doped region 112 may extend to the lower channel 216 on one side of the lower channel 216, for example as would occur with respect to the FIG. 44 embodiment with respect to doped distal portion 192a. This may reduce the channel length and resistance while maintaining the logical functionality of the transistor 186 (FIG. 28).

In the operation of some embodiments, substantially the entire channel 212 illustrated by FIG. 29 may be formed when the gates 180, 182, and 162 are energized. That is, both the upper channel 214 and the lower channel 216 may be formed at generally the same time to form a current path that extends through both. In some instances, though, not all of the gates 180, 182, and 162 are energized at the same time and only portions of the channel 212 are formed. For example when the cell 186 shares a row or column with another cell 186 that is being accessed but is not itself being accessed, only a portion of the channel 212 may be established, and current may not flow between the source 192 and a drain 194. This aspect of the cells 186 is illustrated by the circuit schematic of FIG. 30, which represents a generally equivalent circuit. As illustrated, a current I flowing from the source $V_S$ (192 in FIG. 28) to the drain $V_D$ (194 in FIG. 28) passes through both the upper transistor 188 and the lower transistor 190. Thus, the transistors 188 and 190 may form an AND gate that conducts current I if the gates 180, 182, and 162 (represented by $V_{CG}$ and $V_{RG}$) are all energized, but not if the gate 162 or one of the gates 180 and 192 is not energized.

In the illustrated embodiment, the gates 180 in 182 are at generally the same voltage and may be connected to one another at the ends of the fin rows 174 (FIG. 25), but in other embodiments, these gates 180 and 182 may be controlled independent of one another. For example, the voltage of one of the gates 180 or 182 may remain generally constant while the other gate 180 and 182 changes. In some embodiments, the lower transistor 190 may form an OR gate that conducts current if either gate 180 or gate 182 is energized.

Figure 31:
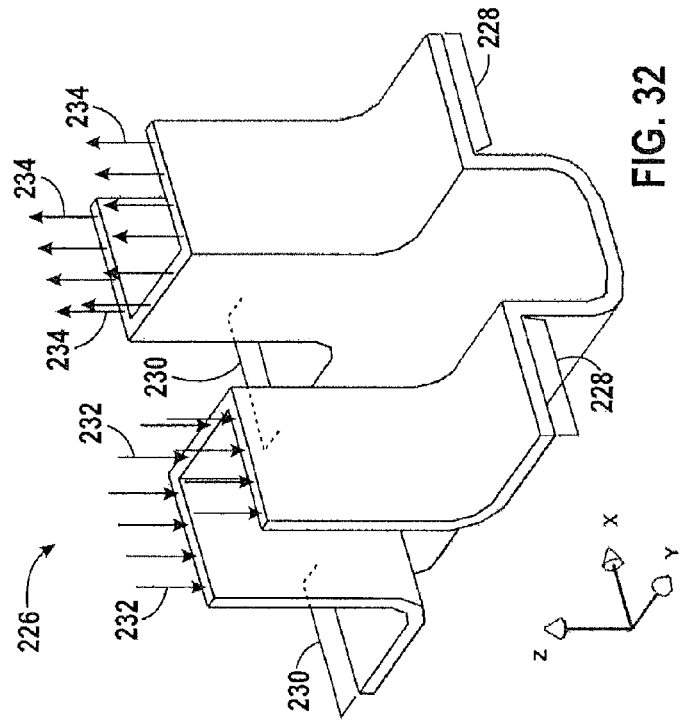
FIGS. 31-33 illustrate a second embodiment of a dual-transistor data cell.
Figure 32:
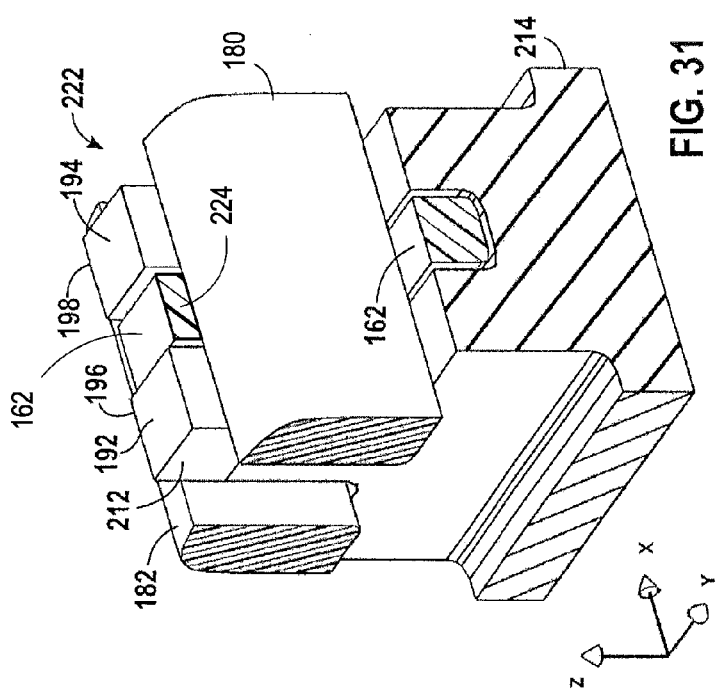
Figure 33:
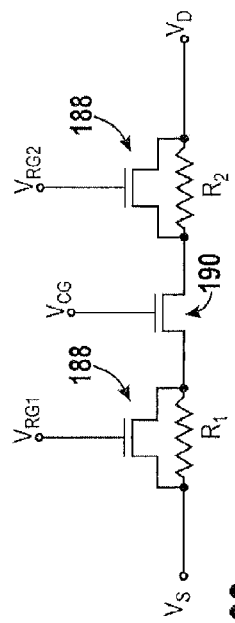

FIGS. 31-33 illustrate a second example of a cell 222. In this embodiment, the column gate 162 includes a leg 224 that overlaps the upper doped region 212. The leg 224 extends between the legs 196 and 198 and between the row gates 180 and 182. (The previous embodiment of a cell 186 may also include a leg, but its leg may be shorter and may not overlap the upper doped region 212.) When the gates 180, 182, and 162 are energized, the cell 222 may establish a channel 226, as illustrated by FIG. 32. The illustrated channel 226 may include supplemental channel volumes 228 and 230 that are established by the row gates 180 and 182. The channel 226 may receive current from the source 192, as illustrated by arrows 232, and output current through the drain 194, as illustrated by arrows 234.

In operation, the resistance of the cell 222 may be adjusted by energizing the row gates 180 and 182. When the row gate 180 is energized, the supplemental channel volume 228 may provide an additional volume of conductive material to carry a current between the source 192 and the drain 194, and when the row gate 182 is energized, the supplemental channel volume 230 may provide additional conductive material to carry this current. When all of the gates 180, 182, and 162 are energized, the cell 222 may be in its lowest resistance state. When one of the gates 180 or 182 and the gate 162 are energized, the cell 222 may be in an intermediate resistance state, and when neither of the gates 180 and 182 are energized, and the gate 162 is energized, the cell 222 may be in a higher resistance state. When the gate 162 is not energized, regardless of whether the gates 180 and 182 are energized, the cell 222 may be off and may conduct little to no current.

The operation of the cell 222 may be represented by the circuit schematic of FIG. 33, in which $V_{CG}$ represents the voltage of the column gate 162, $V_S$ represents the voltage of the source 192, $V_{RG1}$ represents the voltage of the row gate 180, $V_{RG2}$ represents the voltage of the row gate 182, $R_1$ represents the change in resistance when the row gate 180 is not energized, and $R_2$ represents the change in resistance when the row gate 182 is not energized.

Figure 34:
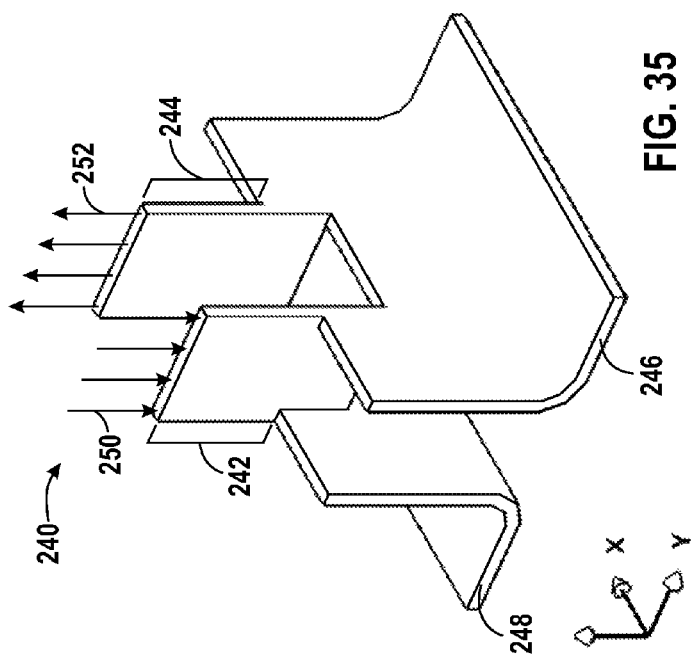
FIGS. 34-36 illustrates a third embodiment of a dual-transistor data cell.
Figure 35:
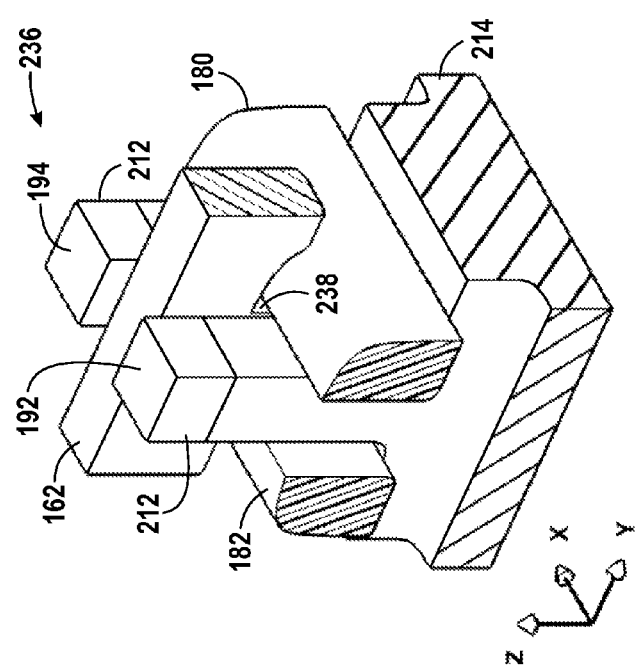
Figure 36:
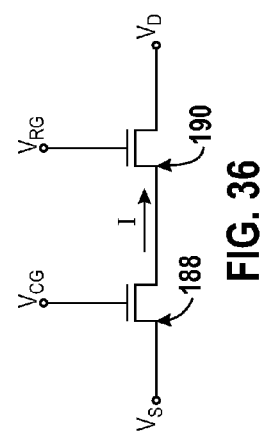

A third embodiment of a cell 236 is illustrated by FIGS. 34-36. In contrast with the previous embodiments, the cell 236 includes a column gate 162 that is disposed above the row gates 180 and 182. In some embodiments, the column gate 162 may be formed after the row gates 180 and 182. A portion of the column gate 162 may form a leg 238 that overlaps and extends between the row gates 180 and 182 to establish overlapping channels.

An example of a channel 240 formed by the cell 236 is illustrated by FIG. 35. The channel 240 may include an upper source-side channel 242, an upper drain-side channel 244, and row channels 246 and 248. Current may enter the channel 240 through the upper source-side channel 242, as illustrated by arrows 250, and exit through the upper drain-side channel 244, as illustrated by arrows 252.

The cell 236 is represented in schematic form by FIG. 36. The cell 236 may form an AND gate that permits current to flow between the source 192 and the drain 194 when each of the gates 162, 180, and 182 is energized. In some embodiments, the gates 180 and 182 may be controlled independently from one another, and the cell 236 may conduct current when the column gate 162 and either the row gate 180 the row gate 182 is energized.

A fourth embodiment of a cell 254 is illustrated by FIGS. 37-39. In this embodiment, the column gate 162 is again disposed above the row gates 180 and 182, but the row gates 180 in 182 overlap the upper doped region 212. As a result, in some embodiments, either the column gate 162, the row gate 180, or the row gate 182 may establish a channel between the source 192 and the drain 194. An example of a channel 256 that may be formed when all of the gates 162, 180, and 182 are energized is illustrated by FIG. 38. The channel 256 may include generally symmetric row gate channels 258 and 260 and a generally orthogonal channel 262 that, in the illustrated embodiment, generally has a U-shape. The cell 254 may operate according to the circuit diagram illustrated by FIG. 39. The cell 254 may conduct a current between the source 192 and the drain 194 if either the row gate 180 is energized, the column gate 162 is energized, or the row gate 182 is energized. Thus, in some embodiments, the cell 254 may form an OR gate. The cell 254 may also be used to modulate the resistance between the source 192 and the drain 194. For example, the resistance may be lowered by energizing all of the gates 162, 180, and 182, raised to an intermediate state by energizing two of the gates 162, 180, or 182, or raised to a higher state by energizing only one of the gates 162, 180, or 182.

The cells 186, 222, 236, and 254 may be used to build a variety of types of devices. For example, a logic device, such as a central processing unit, an application-specific integrated circuit, a field-programmable gate array, a digital-signal processor, or a system-on-a-chip, may be built with one or more of the cells 186, 222, 236, and 254. In some embodiments, one or more of these cells 186, 222, 236, and 254 may be used to build a memory device. The memory device may be a nonvolatile memory device with various types of nonvolatile memory elements connected to the source 192 or the drain 194 of the cells 186, 222, 236, or 254. Examples of nonvolatile memory elements include a floating gate, a semiconductor-oxide-nitride-oxide semiconductor (SONOS) stack, a programmable metallization element, and ovonic phase-change memory element, a ferromagnetic memory element, or some other form of resisted memory. In another example, volatile memory elements, such as a capacitor, may be connected to the source 192 or the drain 194 of one or more of the cells 186, 222, 236, or 254. An example of such a memory array is illustrated by FIGS. 40 and 41.

Figure 40:
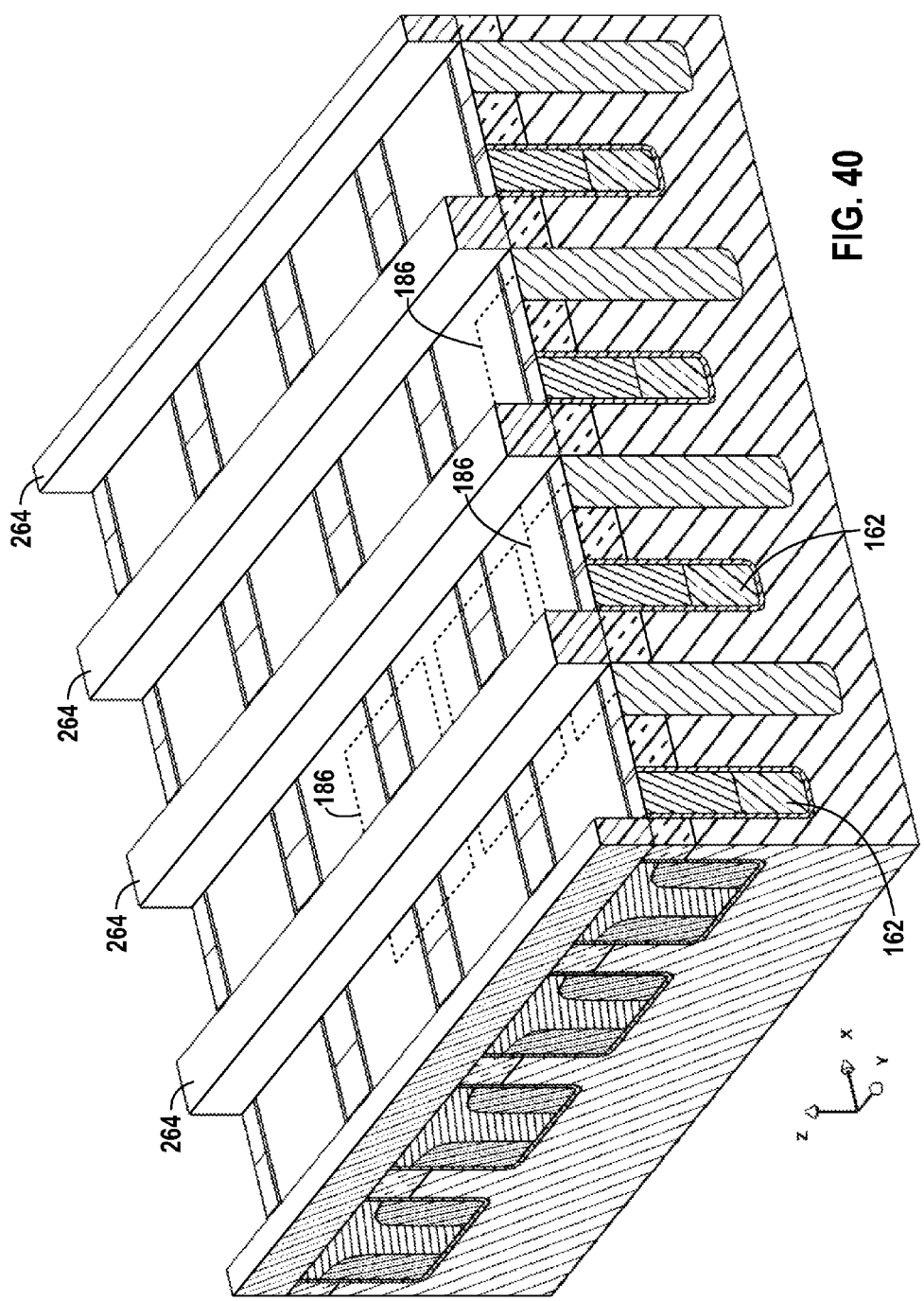
FIGS. 40 and 41 illustrates steps in a process for forming a memory array in accordance with an embodiment of the present technique.

As illustrated by FIG. 40, data lines 264 may be connected to the sources 192 or the drains 194 of the cells 186 to form an array. The illustrated data lines 264 may be generally straight, generally parallel to both each other and the column gates 162, and they may generally extend in the Y direction. The data lines 264 may be made of a conductive material, such as polysilicon or a metal. In other embodiments, thought, the data lines 264 may have some other shape or orientation, or each data line may be shared by two columns of adjacent cells.

Figure 41:
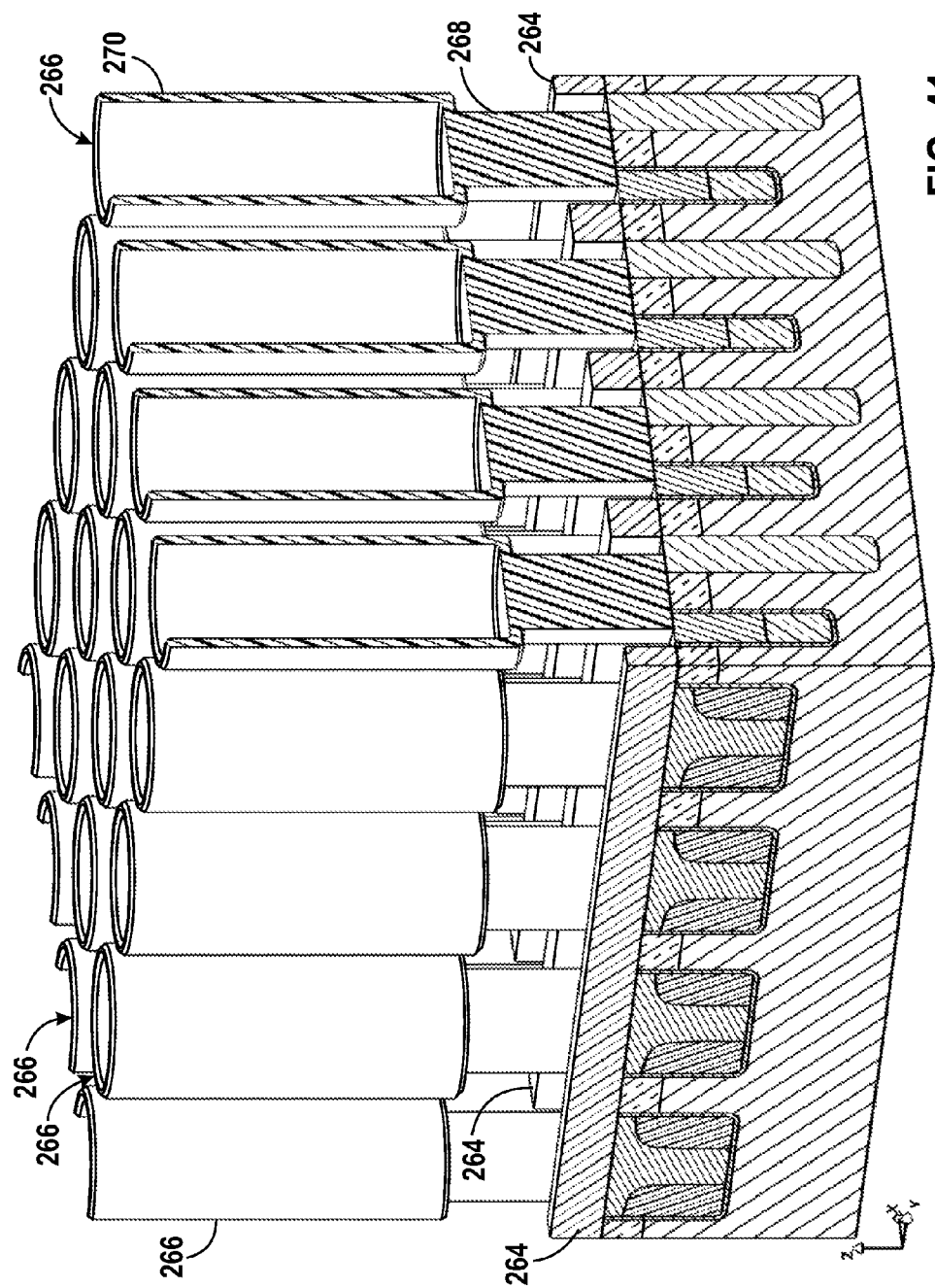

After forming the data lines 264, capacitor plates 266 may be connected to a terminal of the cells 186, as illustrated by FIG. 41. In some embodiments, the capacitor plates 266 may include a generally cylindrical base 268 and a cup-shaped portion 270. The cup shaped portion 270 may increase the surface area of the capacitors plates 266 to increase their capacitance. A dielectric material may be disposed around the data lines 264 and the bases 268 to isolate these components. The cup-shaped portion 270 may be formed by etching holes in a sacrificial material and forming the cup-shaped portion 270 as a sidewall spacer in those holes before removing the sacrificial material. A capacitor dielectric may be deposited on the capacitors 266, and a conductive material may be deposited over the array to form a second plate that is shared by all of the capacitor plates 266. It is not shown in FIG. 41, but a dielectric material may be formed between the data lines 264 and the bases 268 of the capacitor plates 266 to isolate these features from each other.

Figure 42:
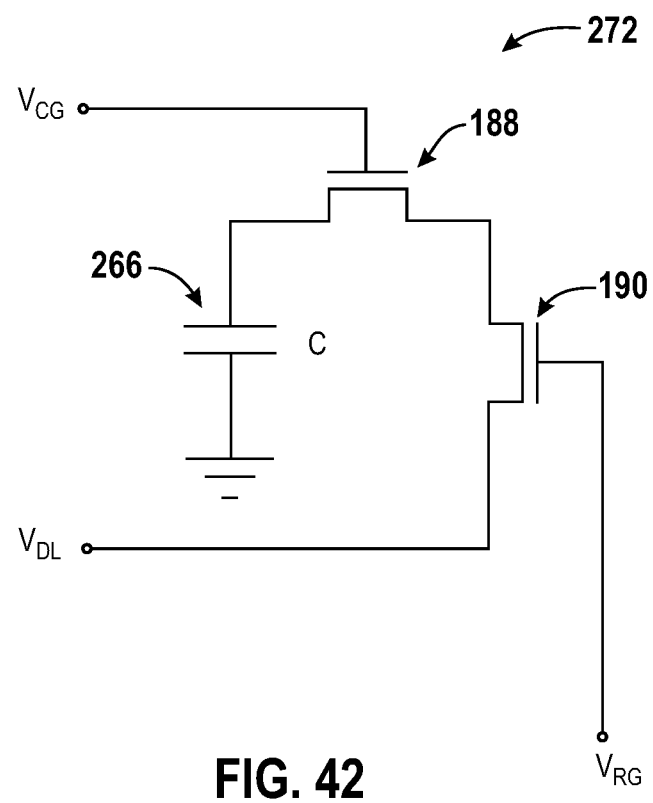
FIG. 42 is a circuit schematic of a dual-transistor memory cell in accordance with an embodiment of the present technique.

FIG. 42 is a circuit schematic of a single memory cell 272 in the array illustrated by FIG. 41. The illustrated capacitor plate 266 may form part of capacitor C, and the upper and lower transistors 188 and 190 may be disposed in series between data line ($V_{DL}$) and the capacitor C. In operation, a charge may be moved between the data line $V_{DL}$ and the capacitor C by energizing one or both of the row gates ($V_{RG}$) and the column gate ($V_{CG}$).

Figure 43:
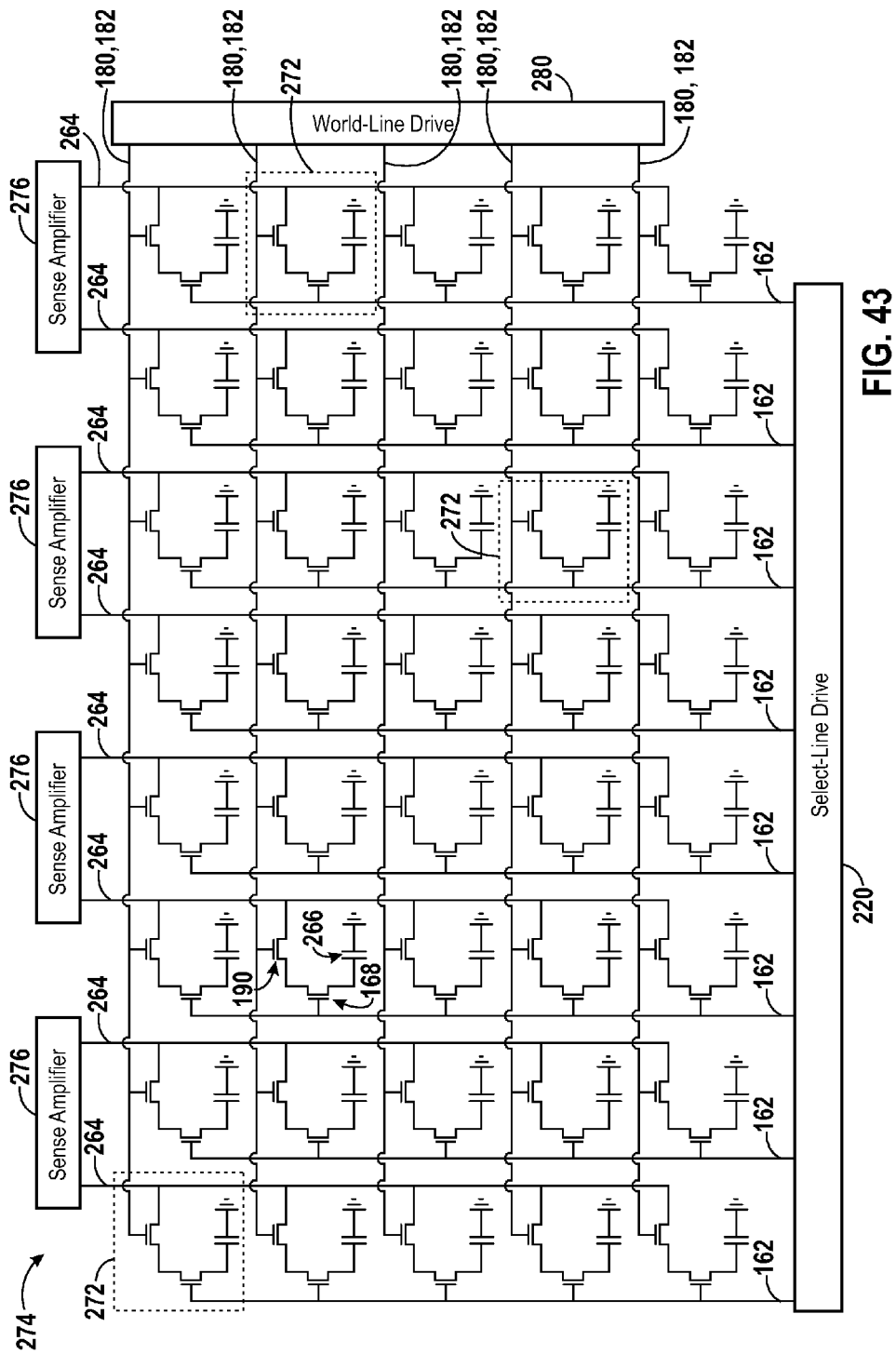
FIG. 43 is a circuit schematic of an array of the dual-transistor memory cells of FIG. 42 in accordance with an embodiment of the present technique.

FIG. 43 illustrates an example of a memory array 274 that may be formed with a plurality of the memory cells 272. This memory array 274, as explained below, may operate without using dummy cells to provide a reference signal. In some embodiments, one of the two transistors 188 and 190 in each memory cell 272 may allow certain memory cells 272 to function both as active memory cells and provide a reference signal.

In this embodiment, the array 274 may include a plurality of sense amplifiers 276, a select line driver 270, and a control-line driver 280. Each of the illustrated sense amplifiers 276 may connect to a plurality of memory cells 272 the via data lines 264 and 264', and the control-line driver 280 may connect to a plurality of memory cells 272 via the row gates 180 and 182.

In operation, the sense amplifiers 276 may read data from the memory cells 272 by determining whether the capacitor plates 266 in the memory cells 272 are storing a charge that corresponds to a logic value of 0 or 1. To determine whether a capacitor plate 266 stores a charge corresponding to a given logic value, the transistors 188 and 190 disposed between the capacitor plate 266 and the data line 264 may be turned on, allowing current to flow between the capacitor plate 266 and the data line 264. As the current flows, the voltage of the data line 264 may change, and the sense amplifier 276 may categorize this change in voltage as indicating that the memory cell 272 stores a particular logic value, e.g., 0 or 1.

When categorizing the change in data line voltage, the sense amplifier may compare the data line voltage to a reference voltage. As mentioned above, in some conventional devices, the reference voltage is supplied by a data line connected to unused memory cells. In the illustrated embodiment, though, the reference voltage may be supplied by functioning memory cells 276 that are temporarily disabled. To disable a group of memory cells, one of their transistors 188 (or 190) may be left in an off state. In some embodiments, the transistors 188 (or 190) may be controlled by the select-line driver 270, which may connect to the column gates 162 and 162'. Thus, to read data from a memory cell on a data line 264, the transistors 188 connected to the data line 264 may be turned on and the transistors 188 connected to the adjacent data line 264' may be turned off. Then, or at generally the same time, the control line (180 or 182) may be energized, turning on the transistor 190 and allowing current to flow between the capacitor plates 266 and the data lines 264, but not data lines 264'. The sense amplifier may compare the voltages or rate of change of the voltages of the data lines 264 and 264' to determine whether the memory elements on the data lines 264 are storing a 0 or a 1. This process may be reversed to read data from the memory cells 272 connected to the data lines 264'. Thus, the array 272 may generate reference signals from functional memory cells 272.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
an upper transistor that is stacked elevationally over a lower transistor, the transistors individually comprising a gate and a channel, the channel of the upper transistor having a depth and the channel of the lower transistor having a depth, the channel depths of the upper and lower transistors having respective portions which overlap laterally relative each other, the gate of the upper transistor crossing over the gate of the lower transistor.

2. The device of claim 1, wherein the channel of the upper transistor has a channel length a portion of which is generally perpendicular to a portion of a channel length of the channel of the lower transistor.

3. The device of claim 1, wherein a portion of the channel of the upper transistor is generally vertical.

4. The device of claim 1, wherein the upper transistor and the lower transistor form an AND gate.

5. The device of claim 1, wherein the upper transistor and the lower transistor form an OR gate.

6. The device of claim 1, wherein a gate of the upper transistor is generally perpendicular to a gate of the lower transistor.

7. The device of claim 1, wherein the lower transistor comprises two gates.

8. The device of claim 1, wherein the upper transistor comprises two gates.

9. The device of claim 1 wherein the upper transistor comprises a pair of spaced vertically elongated conductive channel portions.

10. The device of claim 1 wherein the upper transistor comprises a pair of spaced horizontally elongated conductive channel portions.

11. A device, comprising:
stacked upper and lower transistors which individually comprise a channel, wherein the channel of the upper transistor has a depth and the channel of the lower transistor has a depth, the channel depths of the upper and lower transistors having respective portions which overlap laterally relative each other, the stacked upper and lower transistors comprising a first leg with a doped distal portion and a second leg with a doped distal portion, and wherein the doped distal portion of the second leg is longer than the doped distal portion of the first leg and connects to the channel of the lower transistor.

12. A device, comprising:
stacked upper and lower transistors which individually comprise a channel, wherein the channel of the upper transistor has a depth and the channel of the lower transistor has a depth, the channel depths of the upper and lower transistors having respective portions which overlap laterally relative each other, the upper transistor comprising a pair of spaced legs which comprise a part of the channel of the upper transistor, the spaced legs having respective doped elevationally outermost portions that are elevationally over the channel of the upper transistor.

13. The device of claim 12, wherein the lower transistor comprises a gate extending between the pair of spaced legs.

14. The device of claim 13, wherein the upper transistor comprises a pair of gates disposed on either side of the pair of spaced legs.

15. The device of claim 14 wherein the pair of gates of the upper transistor and the gate of the lower transistor cross perpendicularly.

16. The device of claim 14 wherein the pair of gates of the upper transistor are elongated horizontally and the gate of the lower transistor is elongated horizontally.

17. The device of claim 16 wherein the pair of gates of the upper transistor and the gate of the lower transistor cross perpendicularly.

18. A device, comprising:
stacked upper and lower transistors which individually comprise a channel, wherein the channel of the upper transistor has a depth and the channel of the lower transistor has a depth, the channel depths of the upper and lower transistors having respective portions which overlap laterally relative each other, the lower channel being upwardly U-shaped in lateral cross-section.

19. A device, comprising:
stacked upper and lower transistors which individually comprise a channel, wherein the channel of the upper transistor has a depth and the channel of the lower transistor has a depth, the channel depths of the upper and lower transistors having respective portions which overlap laterally relative each other, the upper transistor comprising a pair of spaced legs which comprise a part of the channel of the upper transistor, the channel of the upper transistor comprising a pair of spaced vertically elongated portions in one of the pair of spaced legs.

20. The device of claim 19 wherein the channel of the upper transistor comprises another pair of spaced vertically elongated conductive channel portions in the other one of the pair of spaced legs.

21. A device, comprising:
stacked upper and lower transistors which individually comprise a channel, wherein the channel of the upper transistor has a depth and the channel of the lower transistor has a depth, the channel depths of the upper and lower transistors having respective portions which overlap laterally relative each other, the upper transistor comprising a pair of spaced and vertically oriented legs which comprise a part of the channel of the upper transistor, the channel of the upper transistor comprising a pair of spaced horizontally elongated portions which project perpendicularly in opposite horizontal directions relative to one of the pair of spaced and vertically oriented legs.

22. The device of claim 21 wherein the channel of the upper transistor comprises another pair of spaced horizontally elongated portions which project perpendicularly in opposite horizontal directions relative to the other one of the pair of spaced and vertically oriented legs.

23. A device, comprising:
stacked upper and lower transistors which individually comprise a channel, wherein the channel of the upper transistor has a depth and the channel of the lower transistor has a depth, the channel depths of the upper and lower transistors having respective portions which overlap laterally relative each other;
the upper transistor comprising a pair of spaced and vertically oriented legs which comprise a part of the channel of the upper transistor, the channel of the upper transistor comprising a pair of spaced vertically elongated portions in one of the pair of spaced and vertically oriented legs; and
the channel of the upper transistor comprising a pair of spaced horizontally elongated portions which project perpendicularly in opposite horizontal directions relative to the one of the pair of spaced and vertically oriented legs.

24. The device of claim 23 wherein,
the channel of the upper transistor comprises another pair of spaced vertically elongated conductive channel portions in the other one of the pair of spaced and vertically oriented legs; and
the channel of the upper transistor comprises another pair of spaced horizontally elongated portions which project perpendicularly in opposite horizontal directions relative to the other one of the pair of spaced and vertically oriented legs.

* * * * *